US011837883B2

(12) United States Patent
Goodchild et al.

(10) Patent No.: US 11,837,883 B2
(45) Date of Patent: Dec. 5, 2023

(54) MULTI-COIL WIRELESS CHARGER VALIDATION

(71) Applicant: AIRA, INC., Chandler, AZ (US)

(72) Inventors: Eric Heindel Goodchild, Phoenix, AZ (US); Camron Vossberg, Tempe, AZ (US)

(73) Assignee: Aira, Inc., Phoenix, AZ (US)

( * ) Notice: Subject to any disclaimer, the term of this patent is extended or adjusted under 35 U.S.C. 154(b) by 428 days.

(21) Appl. No.: 17/153,880

(22) Filed: Jan. 21, 2021

(65) Prior Publication Data

US 2021/0226480 A1 Jul. 22, 2021

Related U.S. Application Data

(60) Provisional application No. 62/964,103, filed on Jan. 21, 2020.

(51) Int. Cl.
| | |
|---|---|
| *H02J 7/00* | (2006.01) |
| *H02J 50/40* | (2016.01) |
| *H02J 50/12* | (2016.01) |
| *H02J 7/02* | (2016.01) |
| *G01R 31/72* | (2020.01) |
| *H02J 50/90* | (2016.01) |
| *G01R 31/40* | (2020.01) |
| *H01F 38/14* | (2006.01) |

(52) U.S. Cl.
CPC ......... *H02J 50/402* (2020.01); *G01R 31/40* (2013.01); *G01R 31/72* (2020.01); *H01F 38/14* (2013.01); *H02J 7/02* (2013.01); *H02J 50/12* (2016.02); *H02J 50/90* (2016.02)

(58) Field of Classification Search
USPC ................ 320/106, 107, 108, 109, 110, 112
See application file for complete search history.

(56) References Cited

U.S. PATENT DOCUMENTS

| | | | |
|---|---|---|---|
| 2013/0021168 A1* | 1/2013 | Jones ...................... | G01R 33/00 324/226 |
| 2016/0103191 A1* | 4/2016 | Von Novak, III ... | H04B 5/0037 324/244 |
| 2019/0267828 A1* | 8/2019 | Goodchild .............. | H02J 50/80 |
| 2020/0341126 A1* | 10/2020 | Yates ...................... | G01S 7/497 |

\* cited by examiner

*Primary Examiner* — Brian Ngo
(74) *Attorney, Agent, or Firm* — Anthony Smyth; LOZA & LOZA, LLP

(57) ABSTRACT

Systems, methods and apparatus for wireless charging are disclosed. A test apparatus has a receiving head configured to provide a measurement signal representative of electromagnetic flux received from one or more transmitting coils of a wireless charging surface, a numerically-controlled stage configured to position the receiving head at a selected point in three-dimensional space above wireless charging surface, and a processor configured to cause the numerically-controlled stage to position the receiving head at the selected point in three-dimensional space, and use the measurement signal to determine magnitude of the electromagnetic flux or power received from the wireless charging surface proximate to the selected point in three-dimensional space.

17 Claims, 16 Drawing Sheets

MULTI-COIL WIRELESS CHARGER VALIDATION

PRIORITY CLAIM

This application claims priority to and the benefit of provisional patent application No. 62/964,103 filed in the United States Patent Office on Jan. 21, 2020 and the entire content of this application is incorporated herein by reference as if fully set forth below in their entirety and for all applicable purposes.

TECHNICAL FIELD

The present invention relates generally to the manufacture and maintenance of charging devices, and more particularly to testing inductive transmitting coils in a wireless charging device.

BACKGROUND

Wireless charging systems have been deployed to enable certain types of devices to charge internal batteries without the use of a physical charging connection. Devices that can take advantage of wireless charging include mobile processing and/or communication devices. Standards, such as the Qi standard defined by the Wireless Power Consortium enable devices manufactured by a first supplier to be wirelessly charged using a charger manufactured by a second supplier. Standards for wireless charging are optimized for relatively simple configurations of devices and tend to provide basic charging capabilities.

Improvements in wireless charging capabilities are required to support continually increasing complexity of mobile devices and changing form factors. The improvements in wireless charging capabilities can increase the complexity of wireless charging devices, requiring improved testing capabilities.

DETAILED DESCRIPTION

Figure 1:
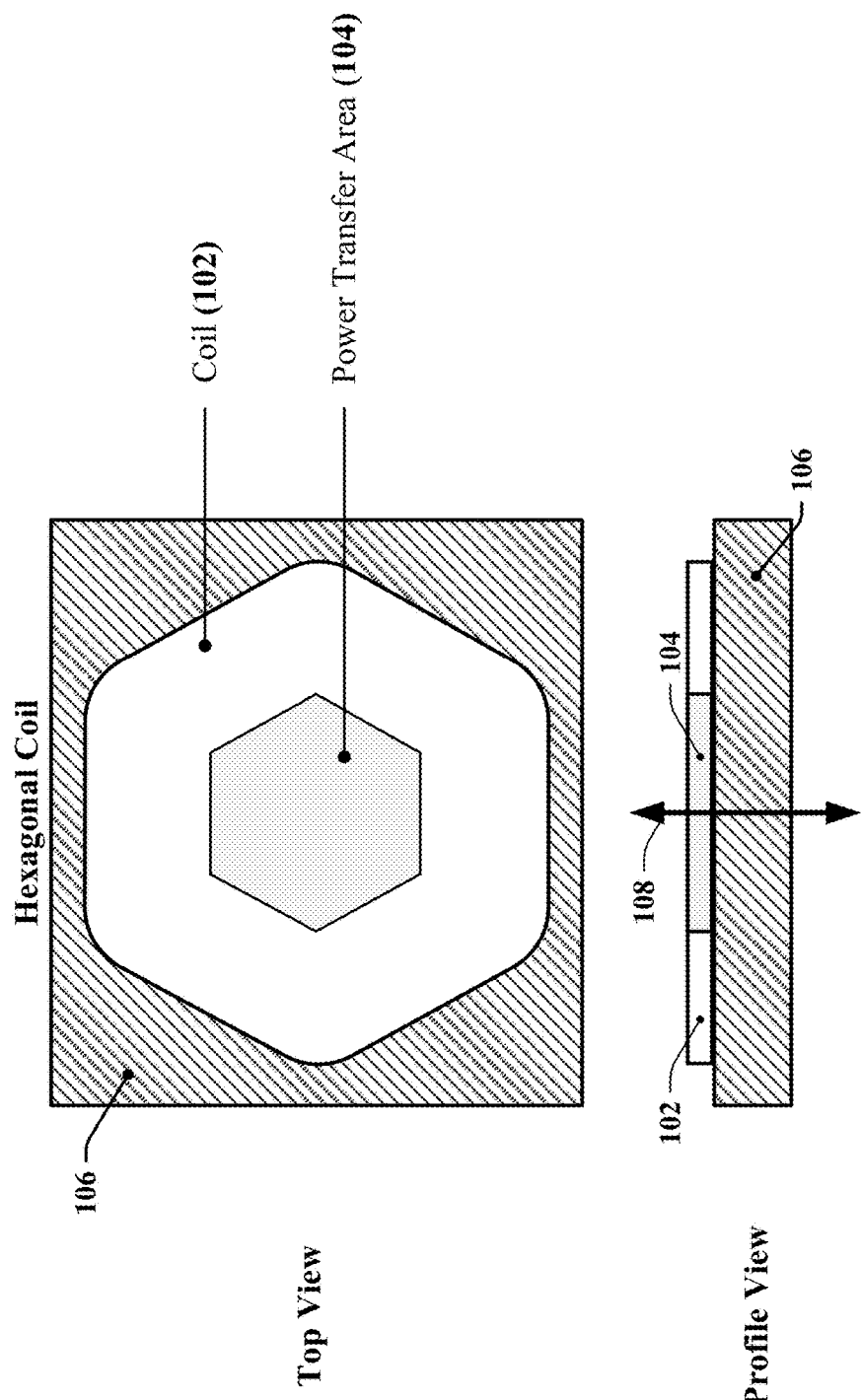
FIG. 1 illustrates an example of a charging cell that may be employed to provide a charging surface in accordance with certain aspects disclosed herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of wireless charging systems will now be presented with reference to various apparatus and methods. These apparatus and methods will be described in the following detailed description and illustrated in the accompanying drawing by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a processor-readable storage medium. A processor-readable storage medium, which may also be referred to herein as a computer-readable medium may include, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), Near Field Communications (NFC) token, random access memory (RAM), read only memory (ROM), programmable ROM (PROM), erasable PROM (EPROM), electrically erasable PROM (EEPROM), a register, a removable disk, a carrier wave, a transmission line, and any other suitable medium for storing or transmitting software. The computer-readable medium may be resident in the processing system, external to the processing system, or distributed across multiple entities, including the processing system. Computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

Overview

Certain aspects of the present disclosure relate to systems, apparatus and methods applicable to wireless charging devices that provide a free-positioning charging surface that has multiple transmitting coils or that can concurrently charge multiple receiving devices. In one aspect, a controller in the wireless charging device can locate a device to be charged and can configure one or more transmitting coils optimally positioned to deliver power to the receiving device. Charging cells may be provisioned or configured with one or more inductive transmitting coils and multiple charging cells may be arranged or configured to provide the charging surface. The location of a device to be charged may be detected through sensing techniques that associate location of the device to changes in a physical characteristic centered at a known location on the charging surface. In some examples, sensing of location may be implemented using capacitive, resistive, inductive, touch, pressure, load, strain, and/or another appropriate type of sensing.

Certain aspects disclosed herein relate to testing improved wireless charging techniques and systems, apparatus and methods that accommodate free placement of chargeable devices on a surface of a multi-coil wireless charging device. Certain aspects of the disclosure can improve the efficiency and capacity of wireless power transmission to a receiving device. In one example, a wireless charging apparatus has a battery charging power source, a plurality of charging cells configured in a matrix, a first plurality of switches in which each switch is configured to couple a row of coils in the matrix to a first terminal of the battery charging power source, and a second plurality of switches in which each switch is configured to couple a column of coils in the matrix to a second terminal of the battery charging power source. Each charging cell in the plurality of charging cells may include one or more coils surrounding a power transfer area. The plurality of charging cells may be arranged adjacent to a charging surface without overlap of power transfer areas of the charging cells in the plurality of charging cells.

According to certain aspects disclosed herein, power can be wirelessly transferred to a receiving device located anywhere on a charging surface that can have an arbitrarily defined size or shape without regard to any discrete placement locations enabled for charging. Multiple devices can be simultaneously charged on a single charging surface. The charging surface may be manufactured using printed circuit board technology, at low cost and/or with a compact design.

Charging Cells

According to certain aspects disclosed herein, a charging surface in a wireless charging device may be provided using charging cells that are deployed adjacent to the charging surface. In one example the charging cells are deployed in accordance with a honeycomb packaging configuration. A charging cell may be implemented using one or more coils that can each induce a magnetic field along an axis that is substantially orthogonal to the charging surface adjacent to the coil. In this disclosure, a charging cell may refer to an element having one or more inductive coils where each inductive coil is configured to produce an electromagnetic field that is additive with respect to the fields produced by other inductive coils in the charging cell and directed along or proximate to a common axis. In this description, an inductive coil in a charging cell may be referred to as a charging coil, a transmitting coil or simply a coil.

In some examples, a charging cell includes coils that are stacked along a common axis. One or more coils may overlap such that they contribute to an induced magnetic field substantially orthogonal to the charging surface. In some examples, a charging cell includes coils that are arranged within a defined portion of the charging surface and that contribute to an induced magnetic field within the defined portion of the charging surface, the magnetic field contributing to a magnetic flux flowing substantially orthogonal to the charging surface. In some implementations, charging cells may be configurable by providing an activating current to coils that are included in a dynamically-defined charging cell. For example, a wireless charging device may include multiple stacks of coils deployed across a charging surface, and the wireless charging device may detect the location of a device to be charged and may select some combination of stacks of coils to provide a charging cell adjacent to the device to be charged. In some instances, a charging cell may include, or be characterized as a single coil. However, it should be appreciated that a charging cell may include multiple stacked coils and/or multiple adjacent coils or stacks of coils.

FIG. 1 illustrates an example of a charging cell 100 that may be deployed and/or configured to provide a charging surface in a wireless charging device. In this example, the charging cell 100 has a substantially hexagonal shape that encloses one or more coils 102 constructed using conductors, wires or circuit board traces that can receive a current sufficient to produce an electromagnetic field in a power transfer area 104. In various implementations, some coils 102 may have a shape that is substantially polygonal, including in the hexagonal charging cell 100 illustrated in FIG. 1. Other implementations may include or use coils 102 that have other shapes. The shape of the coils 102 may be determined at least in part by the capabilities or limitations of fabrication technology or to optimize layout of the charging cells on a substrate 106 such as a printed circuit board substrate. Each coil 102 may be implemented using wires, printed circuit board traces and/or other connectors in a spiral configuration. Each charging cell 100 may span two or more layers separated by an insulator or substrate 106 such that coils 102 in different layers are centered around a common axis 108.

Figure 2:
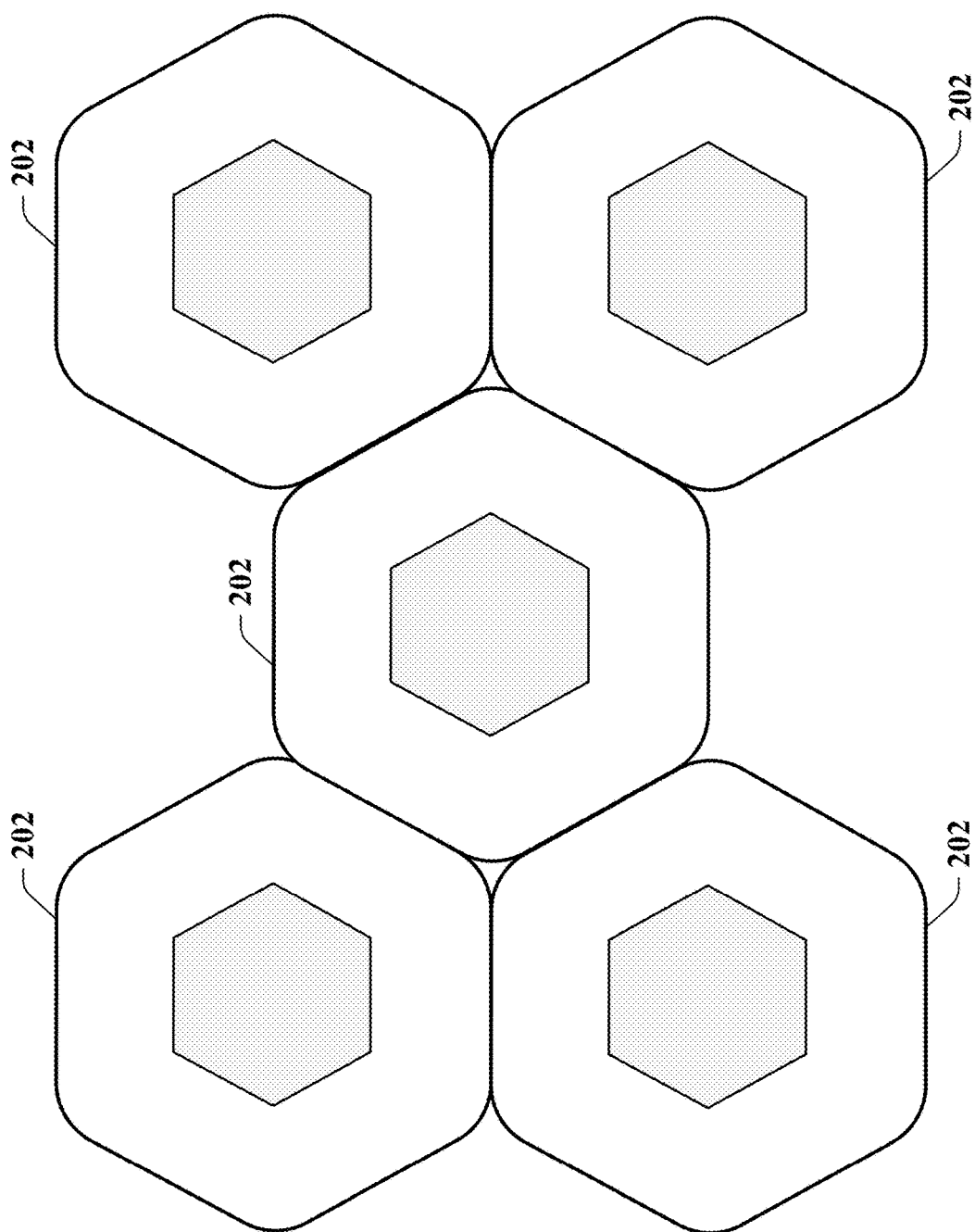
FIG. 2 illustrates an example of an arrangement of charging cells provided on a single layer of a segment of a charging surface that may be adapted in accordance with certain aspects disclosed herein.

FIG. 2 illustrates an example of an arrangement 200 of charging cells 202 provided on a single layer of a segment or portion of a charging surface that may be adapted in accordance with certain aspects disclosed herein. The charging cells 202 are arranged according to a honeycomb packaging configuration. In this example, the charging cells 202 are arranged end-to-end without overlap. This arrangement can be provided without through-holes or wire interconnects. Other arrangements are possible, including arrangements in which some portion of the charging cells 202 overlap. For example, wires of two or more coils may be interleaved to some extent.

Figure 3:
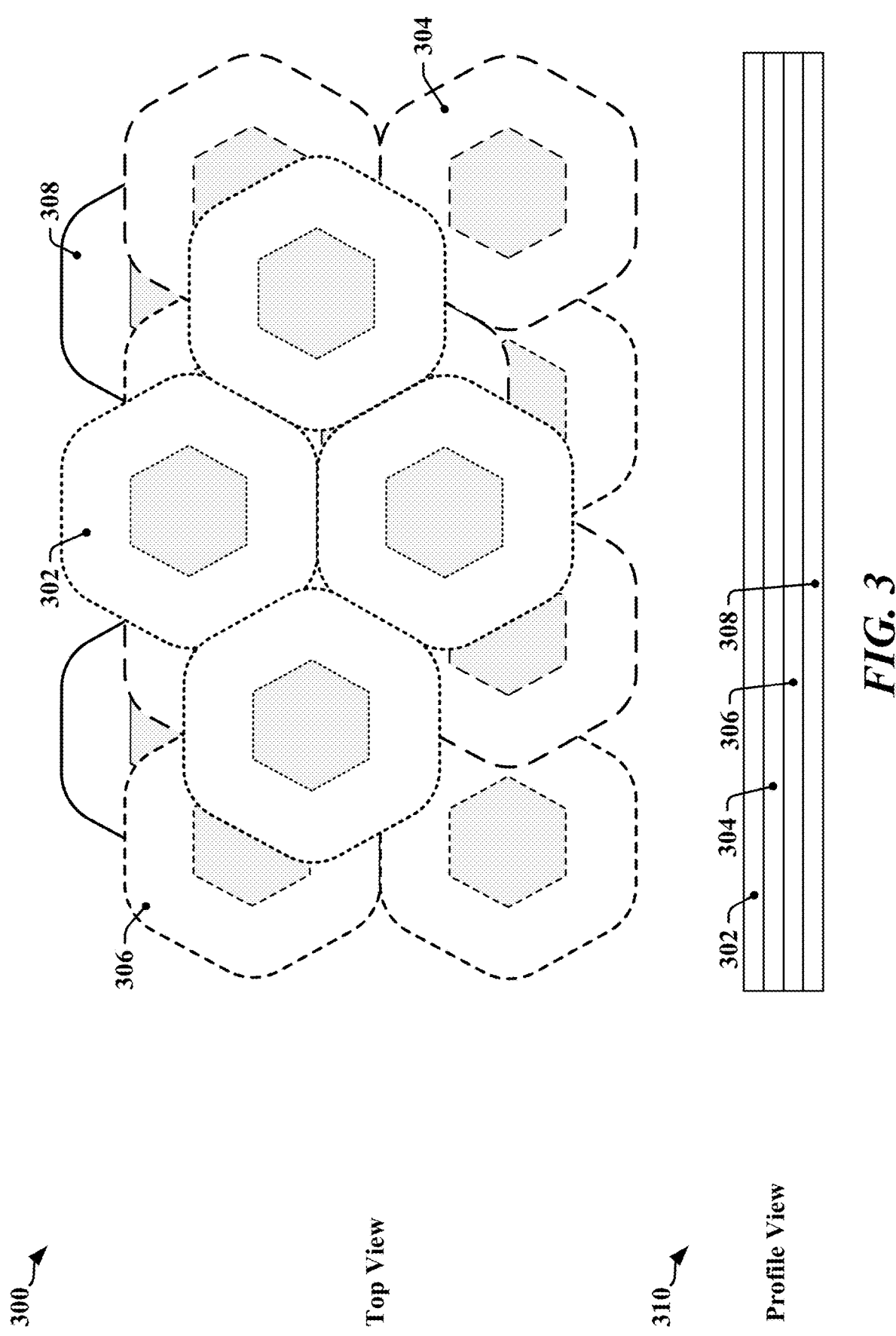
FIG. 3 illustrates an example of an arrangement of charging cells when multiple layers are overlaid within a segment of a charging surface that may be adapted in accordance with certain aspects disclosed herein.

FIG. 3 illustrates an example of an arrangement of charging cells from two perspectives 300, 310 when multiple layers are overlaid within a segment or portion of a charging surface that may be adapted in accordance with certain aspects disclosed herein. Multiple layers of charging cells 302, 304, 306, 308 are provided within the charging surface. The charging cells within each layer of charging cells 302, 304, 306, 308 are arranged according to a honeycomb packaging configuration. In one example, the layers of charging cells 302, 304, 306, 308 may be formed on a printed circuit board that has four or more layers. The arrangement of charging cells 100 can be selected to provide complete coverage of a designated charging area that is adjacent to the illustrated segment.

Figure 4:
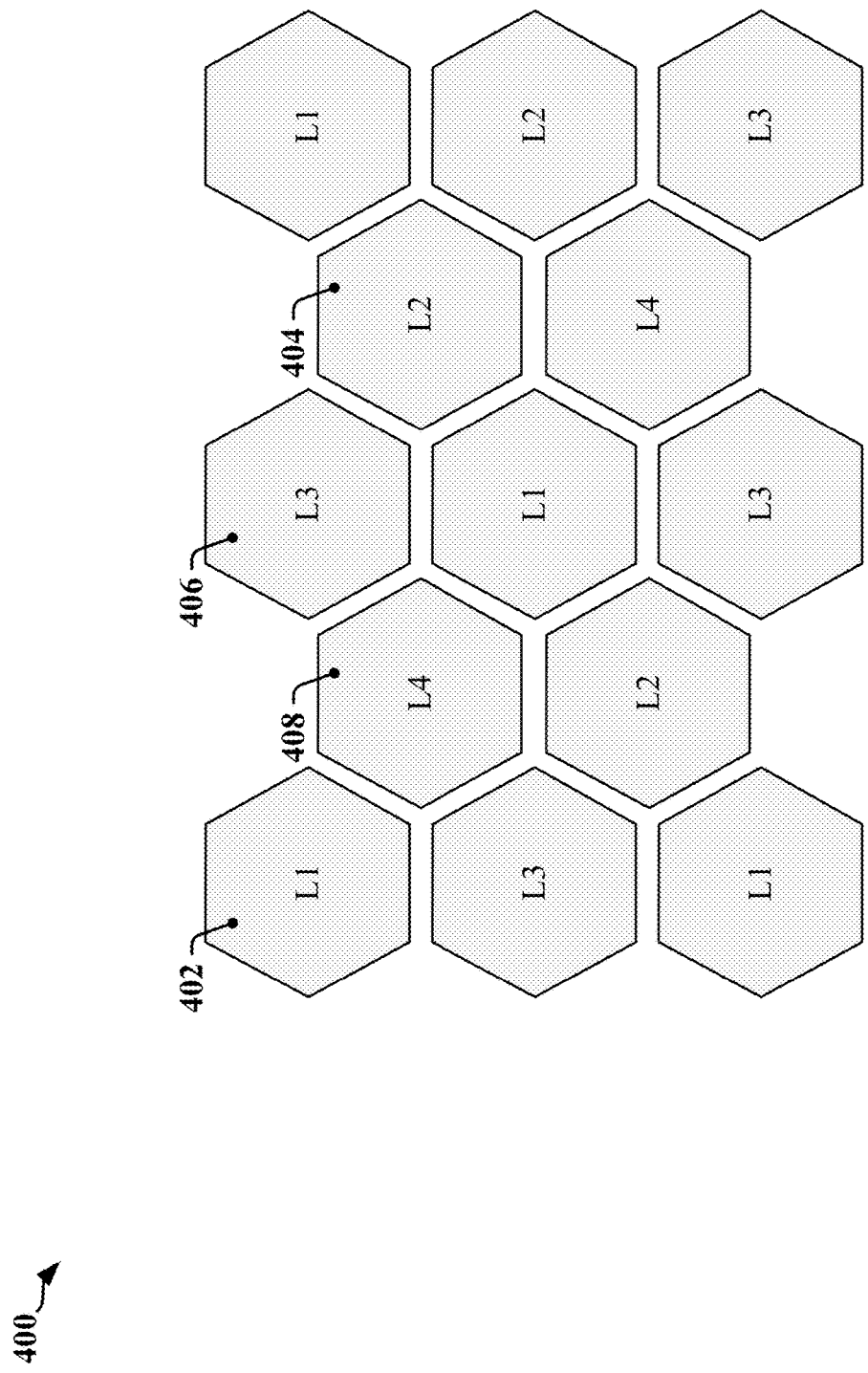
FIG. 4 illustrates the arrangement of power transfer areas provided by a charging surface that employs multiple layers of charging cells configured in accordance with certain aspects disclosed herein.

FIG. 4 illustrates the arrangement of power transfer areas provided in a charging surface 400 that employs multiple layers of charging cells configured in accordance with certain aspects disclosed herein. The illustrated charging surface is constructed from four layers of charging cells 402, 404, 406, 408. In FIG. 4, each power transfer area provided by a charging cell in the first layer of charging cells 402 is marked "L1", each power transfer area provided by a charging cell in the second layer of charging cells 404 is marked "L2", each power transfer area provided by a charging cell in the third layer of charging cells 406 is marked "L3", and each power transfer area provided by a charging cell in the fourth layer of charging cells 408 is marked "L4".

Wireless Transmitter

Figure 5:
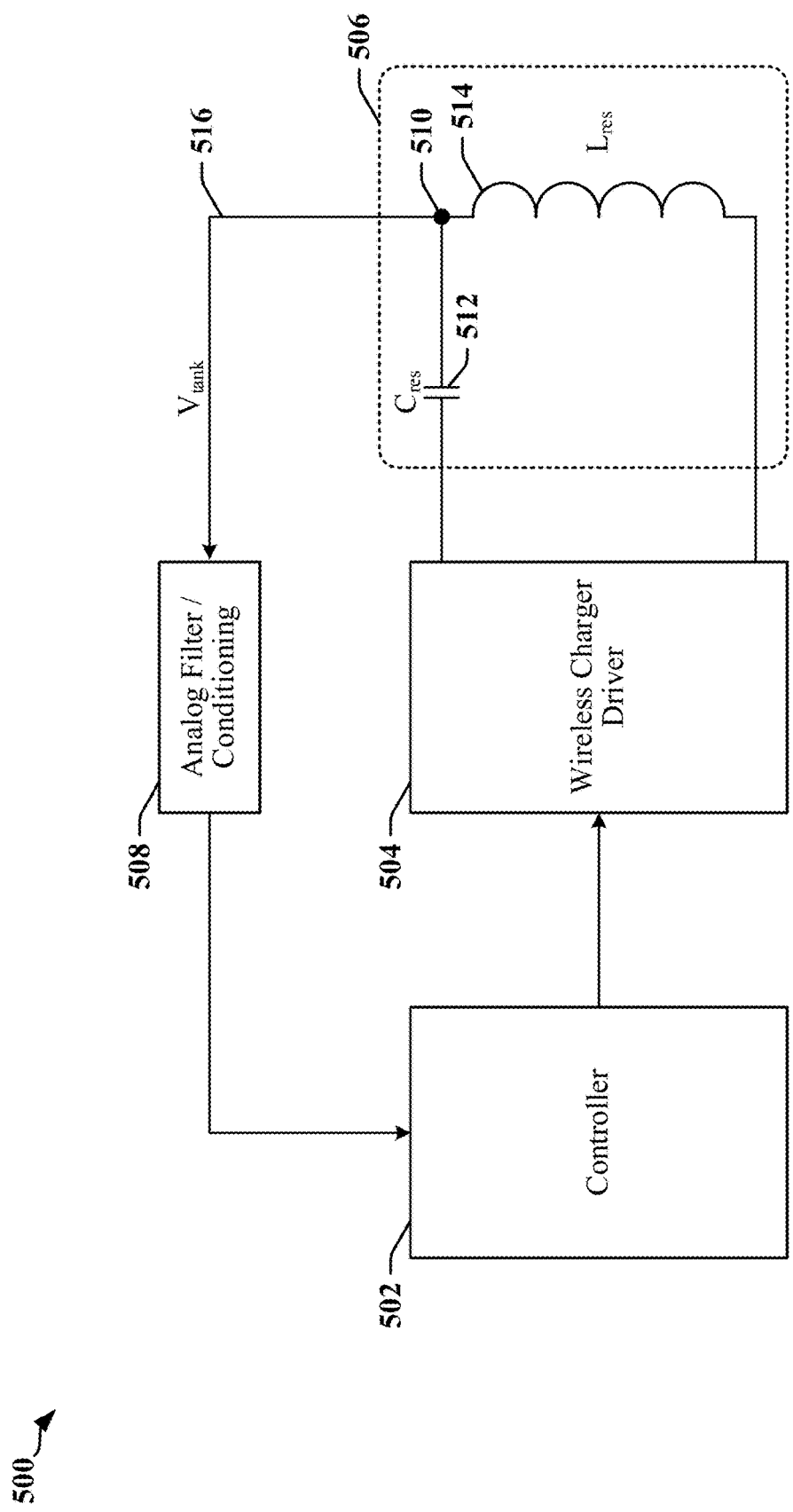
FIG. 5 illustrates a wireless transmitter that may be provided in a charger base station in accordance with certain aspects disclosed herein.

FIG. 5 illustrates an example of a wireless transmitter 500 that may be provided in a base station of a wireless charging device. A base station in a wireless charging device may include one or more processing circuits used to control operations of the wireless charging device. A controller 502 may receive a feedback signal filtered or otherwise processed by a filter circuit 508. The controller may control the operation of a driver circuit 504 that provides an alternating current to a resonant circuit 506. In some examples, the controller 502 may generate a digital frequency reference signal used to control the frequency of the alternating current output by the driver circuit 504. In some instances, the digital frequency reference signal may be generated using a programmable counter or the like. In some examples, the driver circuit 504 includes a power inverter circuit and one or more power amplifiers that cooperate to generate the alternating current from a direct current source or input. In some examples, the digital frequency reference signal may be generated by the driver circuit 504 or by another circuit. The resonant circuit 506 includes a capacitor 512 and inductor 514. The inductor 514 may represent or include one or more transmitting coils in a charging cell that produced a magnetic flux responsive to the alternating current. The resonant circuit 506 may also be referred to herein as a tank circuit, LC tank circuit, or LC tank, and the voltage 516 measured at an LC node 510 of the resonant circuit 506 may be referred to as the tank voltage.

Passive ping techniques may use the voltage and/or current measured or observed at the LC node 510 to identify the presence of a receiving coil in proximity to the charging pad of a device adapted in accordance with certain aspects disclosed herein. Some conventional wireless charging devices include circuits that measure voltage at the LC node 510 of the resonant circuit 506 or the current in the resonant circuit 506. These voltages and currents may be monitored for power regulation purposes and/or to support communication between devices. According to certain aspects of this disclosure, voltage at the LC node 510 in the wireless transmitter 500 illustrated in FIG. 5 may be monitored to support passive ping techniques that can detect presence of a chargeable device or other object based on response of the resonant circuit 506 to a short burst of energy (the ping) transmitted through the resonant circuit 506.

A passive ping discovery technique may be used to provide fast, low-power discovery. A passive ping may be produced by driving a network that includes the resonant circuit 506 with a fast pulse that includes a small amount of energy. The fast pulse excites the resonant circuit 506 and causes the network to oscillate at its natural resonant frequency until the injected energy decays and is dissipated. The response of a resonant circuit 506 to a fast pulse may be determined in part by the resonant frequency of the resonant LC circuit. A response of the resonant circuit 506 to a passive ping that has initial voltage=$V_0$ may be represented by the voltage $V_{LC}$ observed at the LC node 510, such that:

$$V_{LC} = V_0 e^{-\left(\frac{\omega}{2Q}\right)t} \qquad \text{(Eq. 1)}$$

The resonant circuit 506 may be monitored when the controller 502 or another processor is using digital pings to detect presence of objects. A digital ping is produced by driving the resonant circuit 506 for a period of time. The resonant circuit 506 is a tuned network that includes a transmitting coil of the wireless charging device. A receiving device may modulate the voltage or current observed in the resonant circuit 506 by modifying the impedance presented by its power receiving circuit in accordance with signaling state of a modulating signal. The controller 502 or other processor then waits for a data modulated response that indicates that a receiving device is nearby.

Selectively Activating Coils

According to certain aspects disclosed herein, coils in one or more charging cells may be selectively activated to provide an optimal electromagnetic field for charging a compatible device. In some instances, coils may be assigned to charging cells, and some charging cells may overlap other charging cells. The optimal charging configuration may be selected at the charging cell level. In some examples, a charging configuration may include charging cells in a charging surface that are determined to be aligned with or located close to the device to be charged. A controller may activate a single coil or a combination of coils based on the charging configuration which in turn is based on detection of location of the device to be charged. In some implementations, a wireless charging device may have a driver circuit that can selectively activate one or more transmitting coils or one or more predefined charging cells during a charging event.

Figure 6:
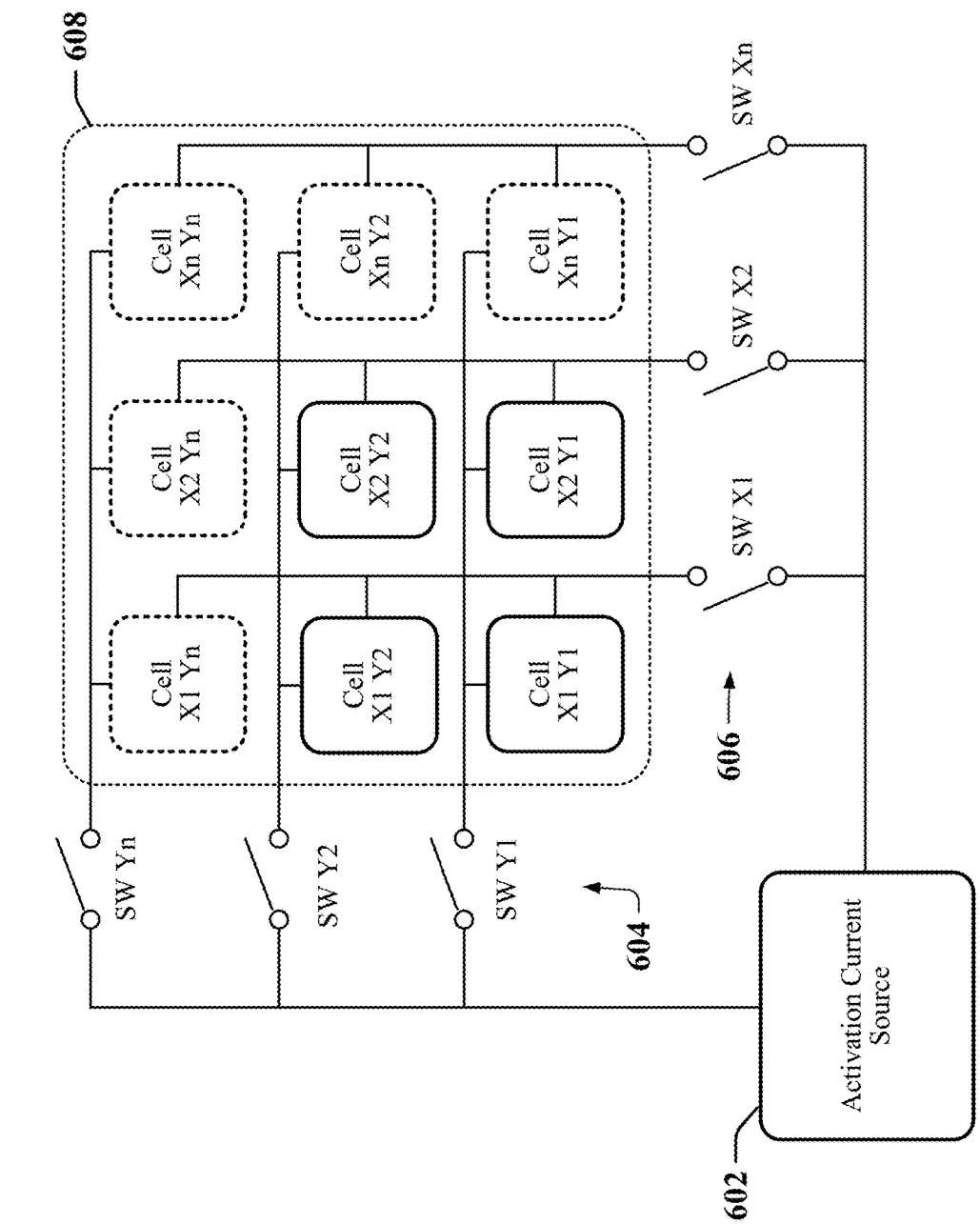
FIG. 6 illustrates a first topology that supports matrix multiplexed switching for use in a wireless charging device adapted with certain aspects disclosed herein.

FIG. 6 illustrates a first topology 600 that supports matrix multiplexed switching for use in a wireless charging device adapted in accordance with certain aspects disclosed herein. The wireless charging device may select one or more charging cells 100 to charge a receiving device. Charging cells 100 that are not in use can be disconnected from current flow. A relatively large number of charging cells 100 may be used in the honeycomb packaging configuration illustrated in FIGS. 2 and 3, requiring a corresponding number of switches. According to certain aspects disclosed herein, the charging cells 100 may be logically arranged in a matrix 608 having multiple cells connected to two or more switches that enable specific cells to be powered. In the illustrated topology 600, a two-dimensional matrix 608 is provided, where the dimensions may be represented by X and Y coordinates. Each of a first set of switches 606 is configured to selectively couple a first terminal of each cell in a column of cells to a first terminal of a voltage or current source 602 that provides current to activate coils in one or more charging cells during wireless charging. Each of a second set of switches 604 is configured to selectively couple a second terminal of each cell in a row of cells to a second terminal of the voltage or current source 602. A charging cell is active when both terminals of the cell are coupled to the voltage or current source 602.

The use of a matrix 608 can significantly reduce the number of switching components needed to operate a network of tuned LC circuits. For example, N individually connected cells require at least N switches, whereas a two-dimensional matrix 608 having N cells can be operated with $\sqrt{N}$ switches. The use of a matrix 608 can produce significant cost savings and reduce circuit and/or layout complexity. In one example, a 9-cell implementation can be implemented in a 3×3 matrix 608 using 6 switches, saving 3 switches. In another example, a 16-cell implementation can be implemented in a 4×4 matrix 608 using 8 switches, saving 8 switches.

During operation, at least 2 switches are closed to actively couple one coil or charging cell to the voltage or current source 602. Multiple switches can be closed at once in order to facilitate connection of multiple coils or charging cells to the voltage or current source 602. Multiple switches may be closed, for example, to enable modes of operation that drive multiple transmitting coils when transferring power to a receiving device.

Figure 7:
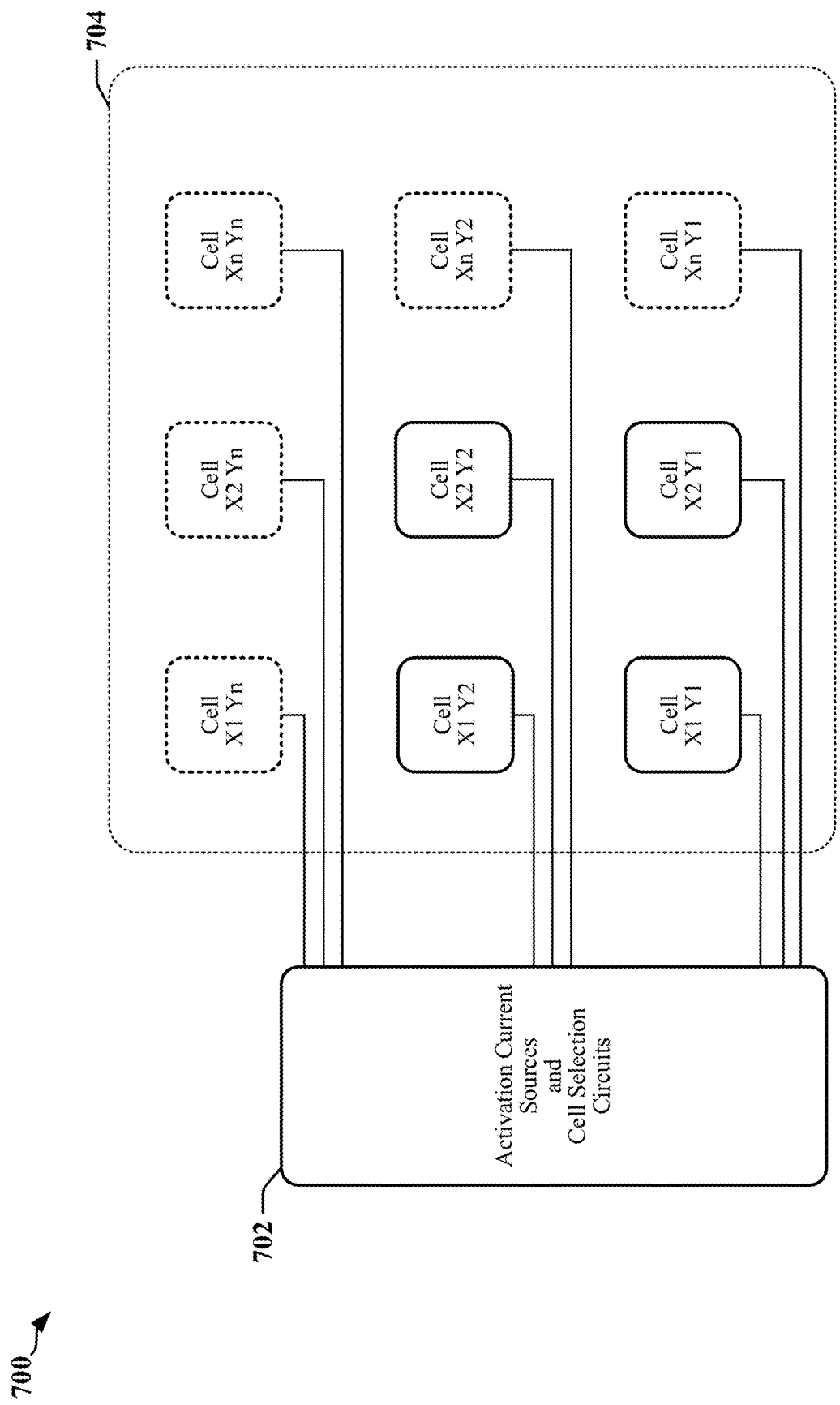
FIG. 7 illustrates a second topology that supports direct current drive in a wireless charging device adapted in accordance with certain aspects disclosed herein.

FIG. 7 illustrates a second topology 700 in which each individual coil or charging cell is directly driven by a driver circuit 702 in accordance with certain aspects disclosed herein. The driver circuit 702 may be configured to select one or more coils or charging cells 100 from a group of coils 704 to charge a receiving device. It will be appreciated that the concepts disclosed here in relation to charging cells 100 may be applied to selective activation of individual coils or stacks of coils. Charging cells 100 that are not in use receive no current flow. A relatively large number of charging cells 100 may be in use and a switching matrix may be employed to drive individual coils or groups of coils. In one example, a first switching matrix may configure connections that define a charging cell or group of coils to be used during a charging event and a second switching matrix may be used to activate the charging cell and/or group of selected coils.

Figure 8:
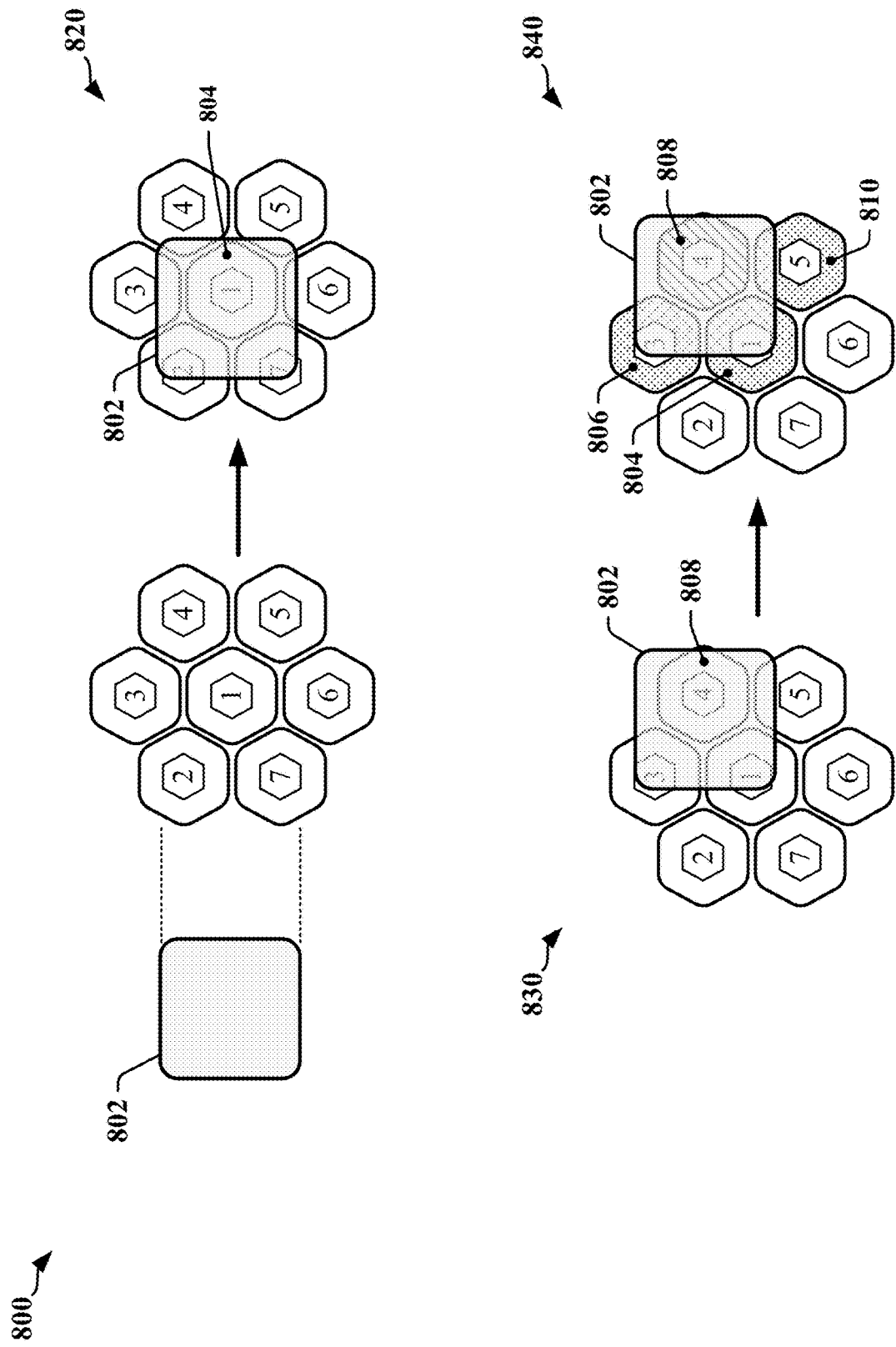
FIG. 8 illustrates first configurations of a charging surface and chargeable device in accordance with certain aspects disclosed herein.

FIG. 8 illustrates certain configurations 800, 820, 830, 840 of a charging surface in a wireless charging device upon which a chargeable device 802 can be freely positioned. The chargeable device 802 has an area that is comparable to the area occupied by each charging cell of a charging surface, or to the area of constituent inductive charging coils in charging cells. In the illustrated example, the chargeable device 802 is somewhat larger than a single charging coil 804. Based on the geometry and arrangement of the charging coils 804, 806, 808, 810 the chargeable device 802 can physically cover adjacent charging coils. In the third and fourth configurations 830, 840, for example, the chargeable device 802 has been placed such that it substantially overlaps a single charging coil 808 and partially covers multiple other charging coils 804, 806, 810. The chargeable device 802 may receive power from one or more charging coils 804, 806, 808, 810 after it has established its presence.

Figure 9:
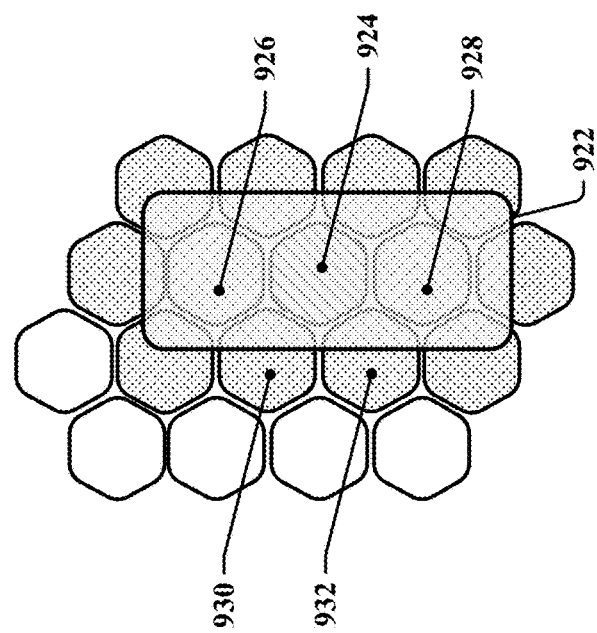
FIG. 9 illustrates second charging configurations on a charging surface when a chargeable device is being charged in accordance with certain aspects disclosed herein.
Figure 9:
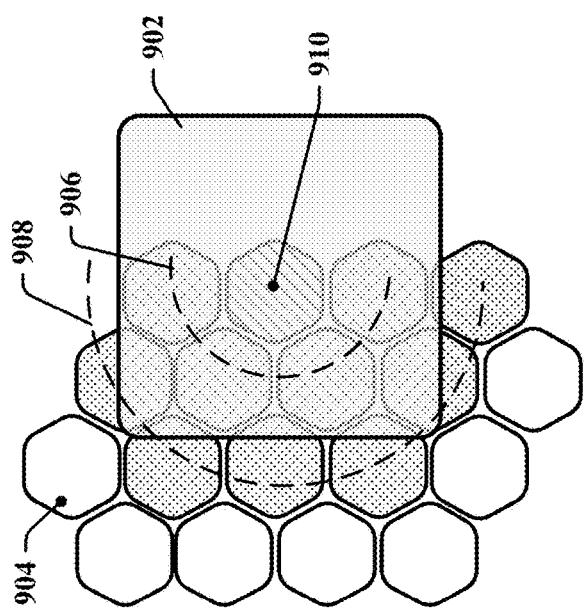

Certain aspects of this disclosure can accommodate charging configurations using multiple adjacent charging coils 804, 806, 808, 810. In accordance with certain aspects of this disclosure, any number of charging coils may be available for charging a chargeable device. FIG. 9 illustrates certain aspects of charging configurations 900, 920 that may be defined for a charging surface when a chargeable device 902, 922 is presented for charging or is being charged. The number and location of usable charging coils may vary based on the type of an optimally-positioned charging coil 910, 926, the charging contract negotiated between the charging surface and the chargeable device 902, 922, and the topology or configuration of the charging surface. For example, the number and location of usable charging coils may be based on the maximum or contracted charging power transmitted through the active charging coil 910 or potentially through another charging coil 904, or on other factors.

In the first configuration 900, the chargeable device 902 may identify coils that are candidates for inclusion in a charging configuration. In the illustrated example, the chargeable device 902 has been placed such that its center is substantially coaxial with a first charging coil 910. For the purposes of this description, it will be assumed that the center of a receiving coil within the chargeable device 902 is located at the center of the chargeable device 902. In this example, the wireless charging device may determine that the first charging coil 910 has the strongest coupling with the receiving coil in the chargeable device 902 with respect to the coils in the next bands 906, 908 of charging coils. In one example, the wireless charging device may define the charging configuration as including at least the first charging coil 910. In this example, the charging configuration may identify one or more charging coils in the first band 906 to be activated during charging procedures.

In the second charging configuration 920, the charging surface may employ sensing techniques that can detect the edges of the chargeable device 922. For example, the outline of the chargeable device 922 can be detected using capacitive sense, inductive sense, pressure, Q-factor measurement or any other suitable device locating technology. In some instances, the outline of the chargeable device 922 can be determined using one or more sensors provided in or on the charging surface. In the illustrated example, the chargeable device 922 has an elongated shape. For the purposes of this description, it will be assumed that the center of a first receiving coil 924 within the chargeable device 922 is located at the center of the chargeable device 922. The wireless charging device may determine that the first charging coil 924 has the strongest coupling with the receiving coil in the chargeable device 922. In one example, the wireless charging device may define the charging configuration as including at least the first charging coil 924. Charging coils 926, 928 that are adjacent to the first receiving coil 924 and that lie under and within the outline of the chargeable device 922 may be included in some charging configurations. Other coils 930, 932 that are adjacent to the first receiving coil 924 and that lie partially under and within the outline of the chargeable device 922 may be defined by some charging configurations to be activated during certain charging procedures.

In some examples, a chargeable device may receive power from two or more active coils. In one example, the chargeable device may have a relatively large footprint with respect to the charging surface and may have multiple receiving coils that can engage multiple charging coils to receive power. In another example, a receiving coil of the chargeable device may be placed substantially equidistant from two or more charging coils and a charging configuration may be defined whereby two or more adjacent charging coils in the charging surface provide power to the chargeable device.

Figure 10:
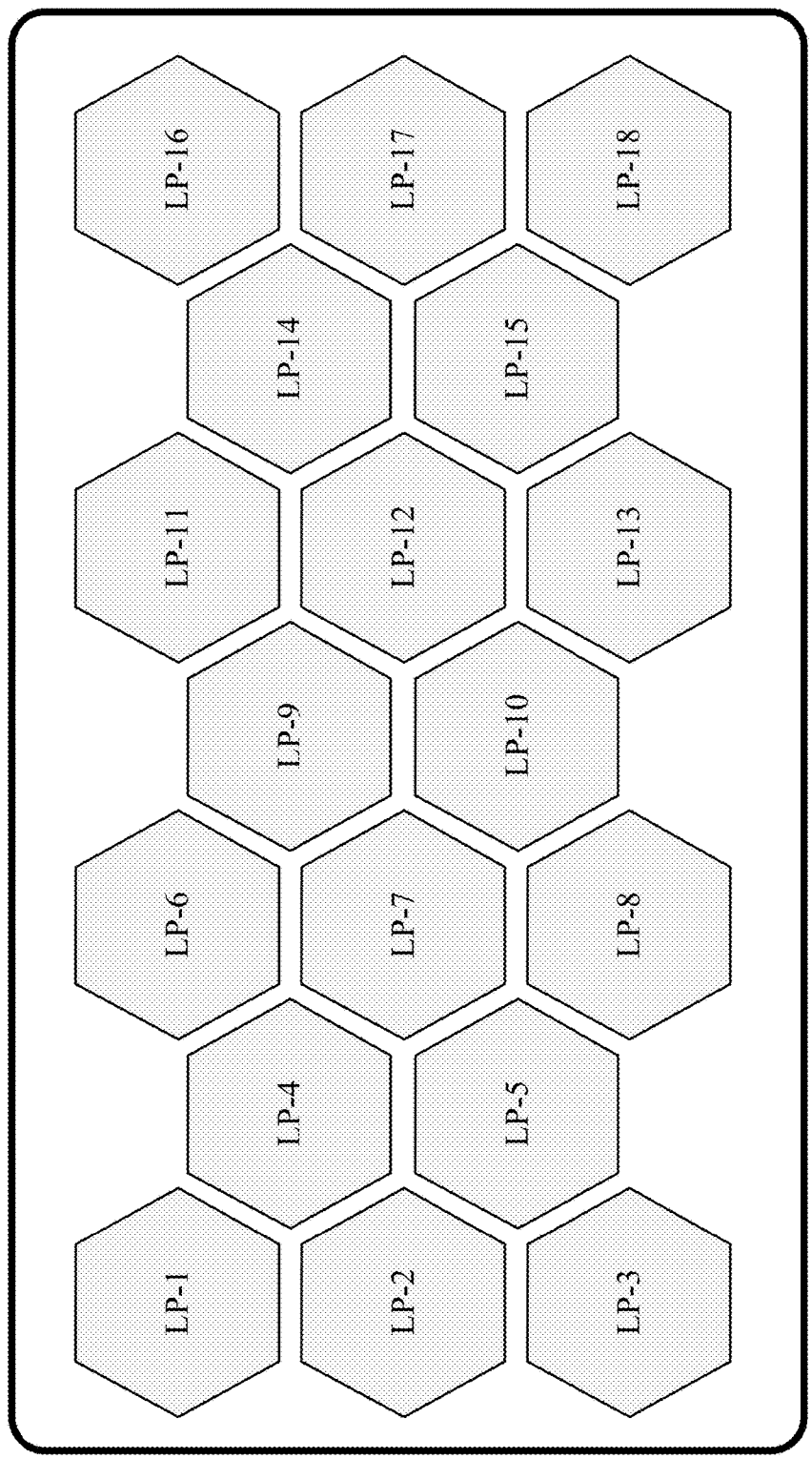
FIG. 10 illustrates a charging surface of a multi-device wireless charger provided in accordance with certain aspects disclosed herein.

FIG. 10 illustrates an example of a charging surface 1000 implemented in a wireless charging system. The charging surface 1000 may be configured to charge multiple devices that can be freely positioned on any available area of the charging surface 1000. In the illustrated example, the charging surface 1000 may be configured to charge up to three mobile telephones, or the like. The charging surface 1000 may also be designed to charge multiple devices smaller than a mobile telephone and/or one or more larger devices, such as oversized smartphones, tablet computers, notebook computers, or the like. A device to be charged can engage and electromagnetically couple with one or more transmitting coils (marked LP-1 through LP-18) in the charging surface 1000. Certain aspects disclosed herein enable a free-position wireless charger to take advantage of the availability of the charging surface 1000 to charge smaller devices such as a smart watch, smart eyewear, headsets, earbuds, other wearable devices and other types of devices.

Certain aspects disclosed herein relate to a free-position wireless charger that can take advantage of the availability of the charging surface 1000 to charge combinations of devices such as smartphones, tablet computing devices, smartwatches, smart eyewear, headsets, earbuds, other wearable devices and other types of devices. Certain aspects of this disclosure relate to apparatus and methods that can be used to test, calibrate, validate and/or characterize the charging surface 1000. In one example, the apparatus and methods may be used during manufacture, assembly and/or configuration of wireless charging devices. In another example, the apparatus and methods may be used at a service or repair facility.

In some examples, the apparatus and methods disclosed herein may be used to verify that each transmitting coil and/or combination of transmitting coils of a finished charging device is capable of functioning within specified limits. In some instances, the specified limits may define a minimum electromagnetic flux to be produced by a transmitting coil at one or more operating points defined for the wireless charging device. In another example, the apparatus and methods may be used to verify that the wireless charging device is capable of detecting presence, location and/or movement of chargeable devices placed on or near the charging surface 1000. In another example, the apparatus and methods may be used to verify that the wireless charging device is capable of communicating control information to a chargeable device placed on or near the charging surface 1000, and/or that the wireless charging device is capable of receiving configuration and feedback information from a chargeable device placed on or near the charging surface 1000. In some implementations, the wireless charging device and a chargeable device may communicate using signals encoded in a charging current using Amplitude Shift Key (ASK) modulation. In another example, the apparatus and methods may be used to verify that the wireless charging device is capable of configuring two or more active coils to concurrently transmit power to a chargeable device. In some instances, the wireless charging device may be configured to provide each of the active coils a substantially similar charging current for transmitting power to the chargeable device. In some instances, the wireless charging device may be configured to provide different charging currents to two or more of the active coils, where the charging currents may differ in magnitude or phase.

Certain aspects disclosed herein provide a testbed and/or test setup that can be used for testing a multi-coil free-position wireless charger, including automated testing of the complete charging surface 1000 for operating efficiency, communications reliability, foreign object detection (FOD), and other factors that can affect the quality of the operation of the multi-coil free-position wireless charger and/or individual transmitting coils in the multi-coil free-position wireless charger.

Figure 11:
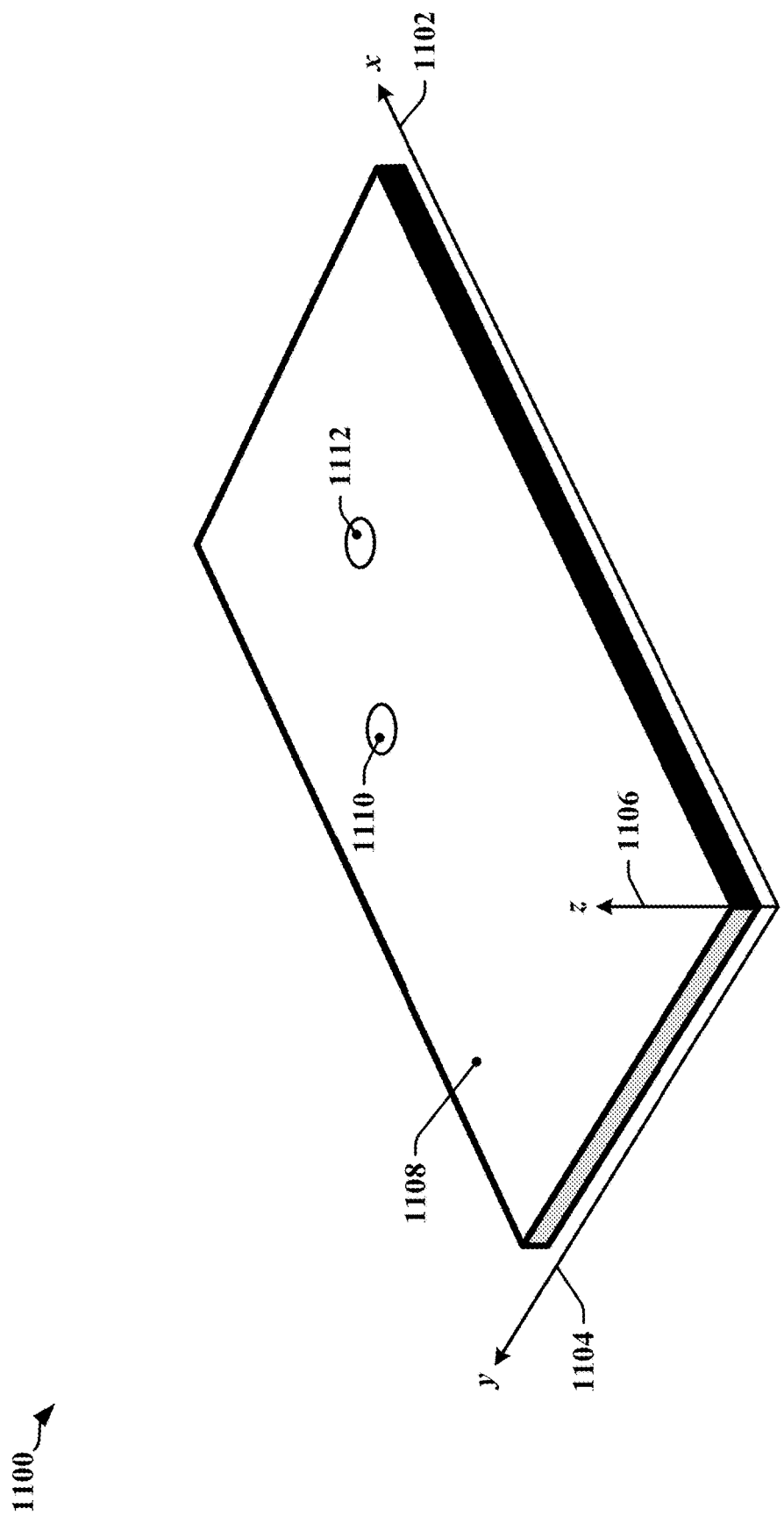
FIG. 11 illustrates certain aspects of a multi-coil free-position wireless charger provided in accordance with certain aspects disclosed herein.

FIG. 11 illustrates certain aspects of a multi-coil free-position wireless charger 1100 provided in accordance with certain aspects disclosed herein. The multi-coil free-position wireless charger 1100 has a charging surface 1108 that may be implemented as a planar upper surface of the multi-coil free-position wireless charger 1100. In some examples, the charging surface 1108 may be curved. In some examples, the charging surface 1108 may be angled such that one side is raised above a horizontal plane that is coincident with another side of the charging surface 1108.

In the illustrated example, the charging surface 1108 is planar and maintained in a substantially horizontal orientation during operation. The charging surface 1108 may be defined by a pair of orthogonal axes. In the illustrated example, the planar surface of the charging surface 1108 is aligned with an x-axis 1102 and a y-axis 1104. A third axis (the z-axis 1106) runs perpendicular to the charging surface 1108. In this example, the x-axis 1102, the y-axis 1104 and the z-axis 1106 are mutually orthogonal and define or represent a three-dimensional space around the charging surface 1108.

The charging surface 1108 includes multiple transmitting coils, including the illustrated transmitting coils 1110, 1112 that are not adjacent to one another. Apparatus and methods disclosed herein may be used to characterize the operation of each transmitting coil 1110, 1112 on the charging surface 1108, the operation of groups of transmitting coils and interactions between two or more transmitting coils 1110, 1112. In one example, the apparatus and methods disclosed herein can be used to measure the magnitude of electromagnetic flux generated by transmitting coils 1110, 1112 and the location of peak electromagnetic flux associated with each transmitting coil 1110, 1112 or group of transmitting coils. The location of peak electromagnetic flux associated with a transmitting coil 1110, 1112 may define a center axis for the transmitting coil 1110, 1112. The location of peak electromagnetic flux associated with a group of transmitting coils may define a center axis for the group of transmitting coils. In some instances, the characteristics associated with individual coils may be adjusted by calibration where, for example, a driver circuit may be configured to increase or decrease the charging current provided to the transmitting coil 1110, 1112 during charging events. In some instances, the characteristics associated with individual coils may be adjusted to maximize or relocate the location of peak electromagnetic flux associated with a group of transmitting coils.

Figure 12:
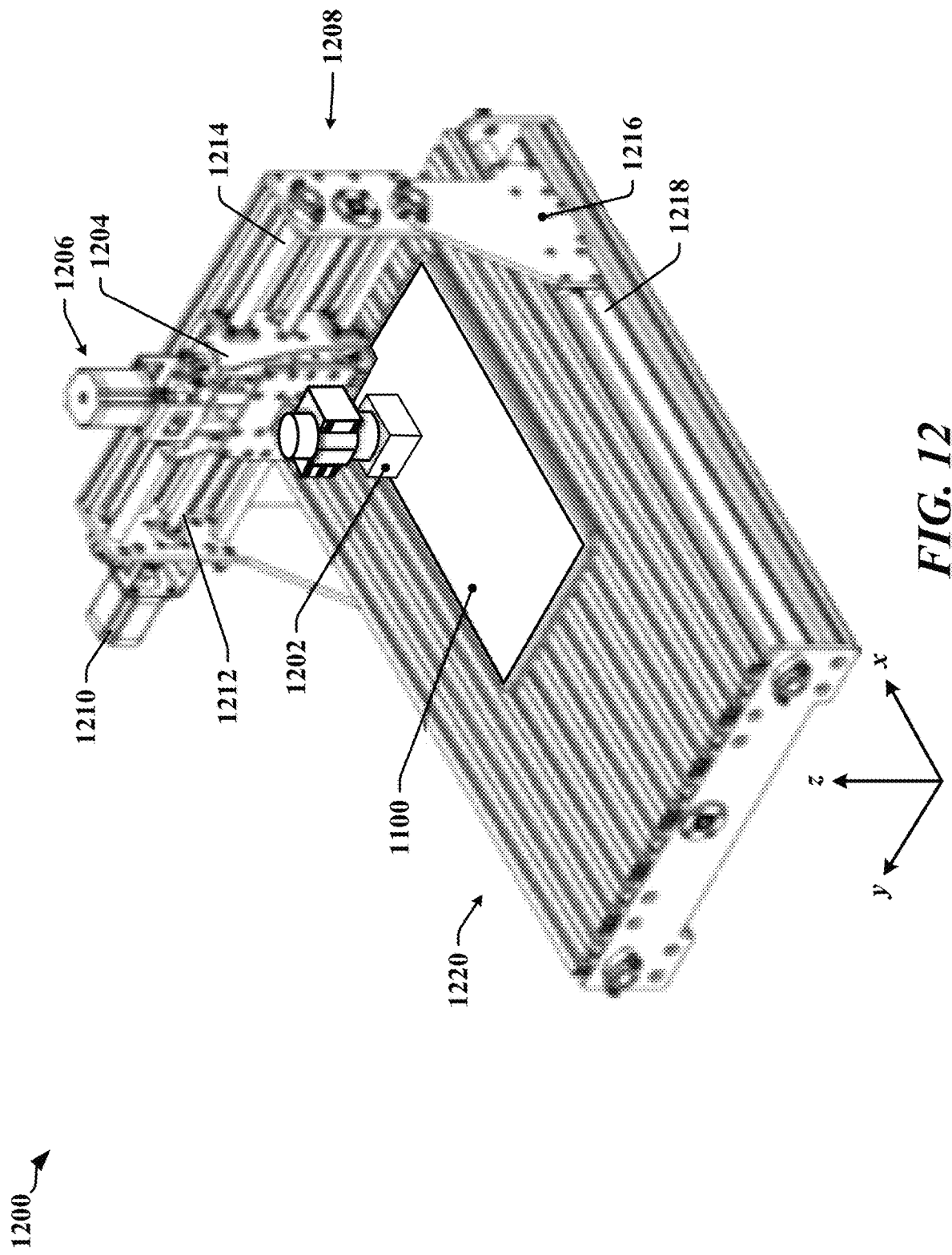
FIG. 12 illustrates certain aspects of an apparatus that may be used as testbed or test rig for a multi-coil free-position wireless charger in accordance with certain aspects disclosed herein.

FIG. 12 illustrates certain aspects of an apparatus 1200 that may be used as testbed or test rig for the multi-coil free-position wireless charger 1100 illustrated in FIG. 11. The apparatus 1200 may include a computer numerical control (CNC) processor or other controller that can control movement of a receiving head 1202 that includes a receiving coil or other sensors that can measure electromagnetic field, flux or wireless signals used during object detection and device charging operations in a wireless charging device. The CNC processor or other controller may also collect or process measurements and other information obtained during test operations. The CNC processor or other controller may be configured to obtain measurements corresponding to all, or substantially all possible permutations and operating modes of the multi-coil free-position wireless charger 1100.

In the illustrated example, the receiving head 1202 is mounted on a carriage 1204 such that the receiving head 1202 can move vertically in a z-axis that is perpendicular to the surface of the multi-coil free-position wireless charger 1100. Movement of the receiving head 1202 is controlled by a z-axis motor 1206 that can be operated to position the receiving head 1202 at a desired, configured or programmed distance above the surface of the multi-coil free-position wireless charger 1100. In one example, the z-axis motor 1206 is a stepping motor that is coupled to a screw-threaded shaft such that each step rotation of the z-axis motor 1206 causes the receiving head 1202 to move a fixed distance in the z-axis. Other types of motor, actuator or mechanisms may be used to control the vertical position of the receiving head 1202.

The carriage 1204 is mounted to a guide rail 1214 of a y-axis gantry 1208 that is configured to move along the x-axis of a CNC stage 1220. Movement of the carriage 1204 is controlled by a y-axis motor 1210 that can be operated to position a center line of the carriage 1204 at a desired, configured or programmed location along the y-axis of the CNC stage 1220. In one example, the y-axis motor 1210 is a stepping motor that is coupled to a screw-threaded shaft 1212 such that each step rotation of the y-axis motor 1210 causes the carriage 1204 to move a fixed distance in the y-axis.

The y-axis gantry 1208 is mounted to a bracket 1216 that can be moved along a guide rail 1218 aligned with the x-axis of the CNC stage 1220. Movement of the y-axis gantry 1208 is controlled by an x-axis motor (not shown) that can be operated to position the bracket 1216 at a desired, configured or programmed location along the x-axis of the CNC stage 1220. In one example, the x-axis motor is a stepping motor that is coupled to a screw-threaded shaft such that each step rotation of the x-axis motor causes the bracket 1216 to move a fixed distance in the x-axis.

Figure 13:
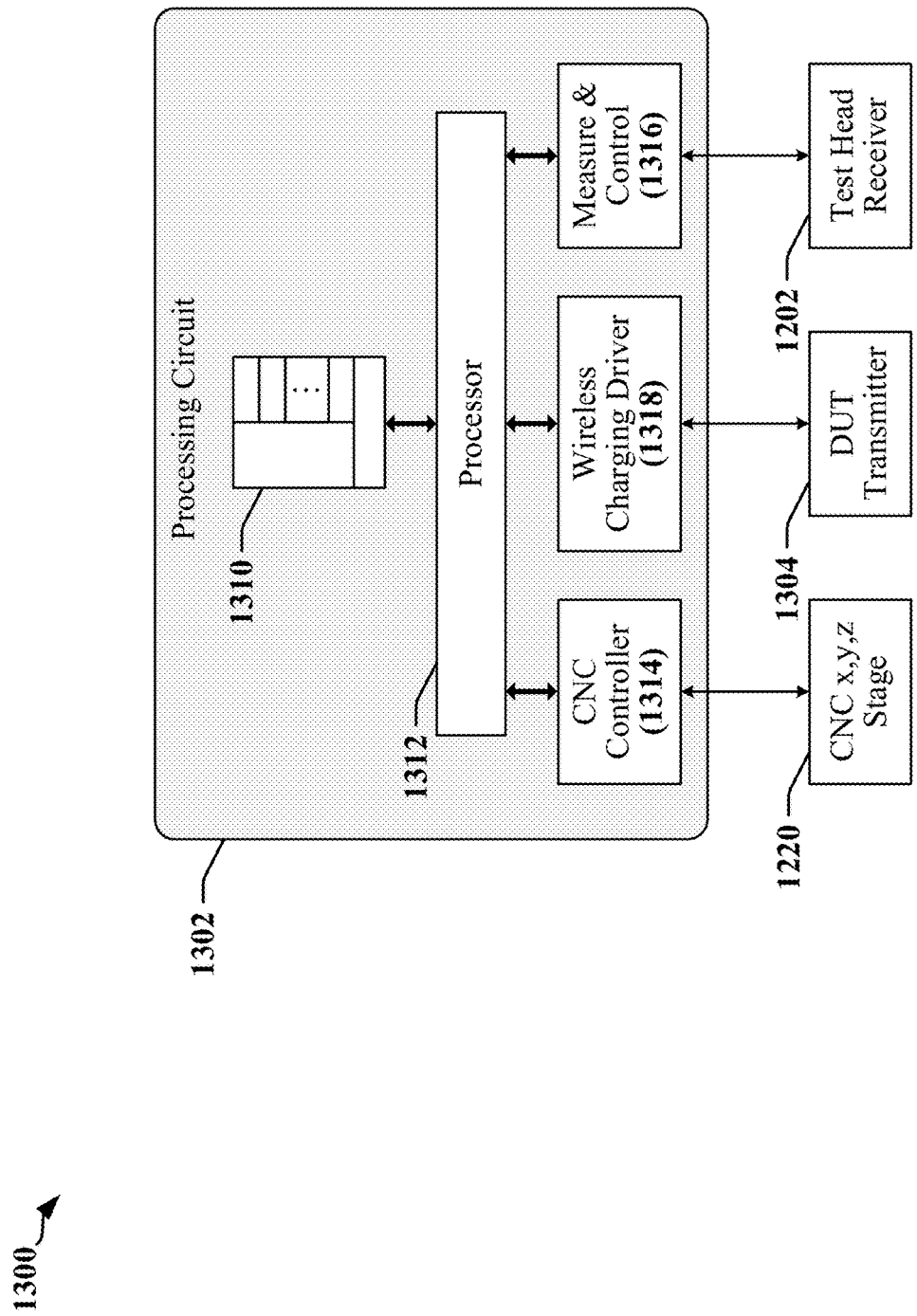
FIG. 13 illustrates a control system for testing a multi-coil free-position wireless charger provided in accordance with certain aspects disclosed herein.

FIG. 13 illustrates a control system 1300 that may be used to operate the apparatus 1200 illustrated in FIG. 12. The control system 1300 includes a processing circuit 1302 that employs one or more processors controlled by some combination of hardware and software modules. In one example, the processing circuit 1302 includes a controller or processor 1312 that is responsible for general processing. General processing may include the dispatch or execution of software stored in a computer-readable medium such as storage 1310. In this respect, the processing circuit 1302, including the processor 1312, may be used to implement any of the methods, functions and techniques disclosed herein. The storage 1310 may be used for storing data that is manipulated by the processor 1312 when executing software, and the software may be configured to implement any one of the methods disclosed herein. The storage 1310 may maintain software modules that include instructions and data that, when installed or loaded on the processing circuit 1302 and executed by the processor 1312, contribute to a run-time image that controls the operation of the processing circuit 1302. When executed, certain instructions may cause the processing circuit 1602 to perform functions in accordance with certain methods, algorithms and processes described herein.

In the illustrated example, the control system 1300 includes a CNC module or circuit 1314, a measurement and control module or circuit 1316 and a wireless charging management module or circuit 1318. One or more of these modules or circuits 1314, 1316, 1318 may be implemented using the controller or processor 1312 that is responsible for general processing. One or more of these modules or circuits 1314, 1316, 1318 may be implemented using a dedicated or allocated processor or controller. In one example, the CNC module or circuit 1314 may be implemented using a commercially-available or proprietary CNC controller. One or more of these modules or circuits 1314, 1316, 1318 may be implemented using a different system or processing circuit. In one example, the wireless charging management module or circuit 1318 may be omitted when the device under test (DUT) is operated such that it controls power transmissions during test procedures.

In the illustrated example, the CNC module or circuit 1314 is coupled to the apparatus 1200 and controls operation of the receiving head 1202, the carriage 1204, the y-axis gantry 1208, the bracket 1216 and other aspects of operation of the CNC stage 1220. The measurement and control module or circuit 1316 may communicate with the receiving head 1202, transmitting control and configuration information and receiving measurements and feedback information. When implemented by the processing circuit 1302, the wireless charging management module or circuit 1318 may generate and implement charging configurations for the wireless charging apparatus and may configure and control the power transmitting circuits 1304 of the DUT.

Figure 14:
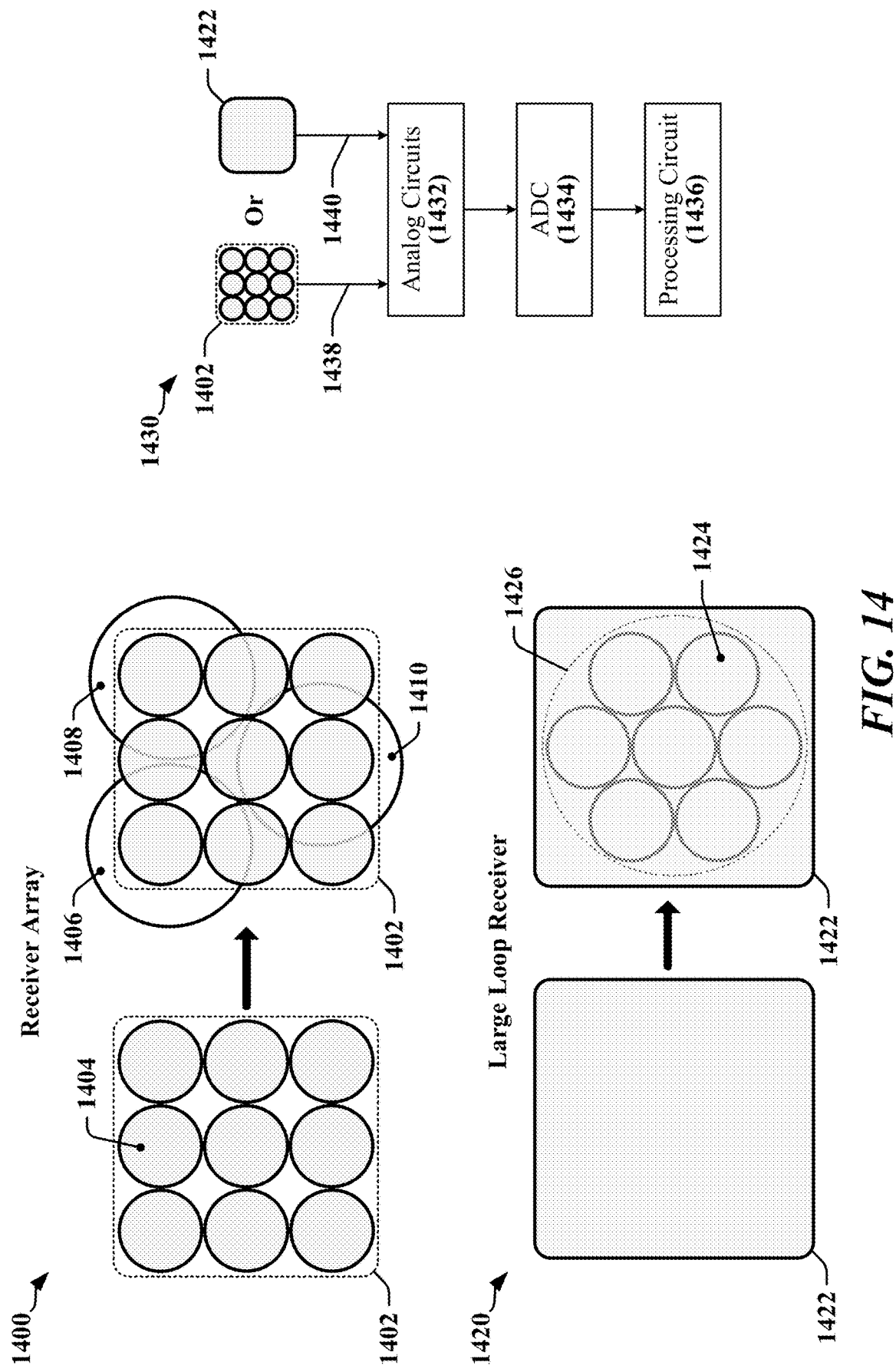
FIG. 14 illustrates examples of receiver coil configurations in a receiving head apparatus that may be used for testing a multi-coil free-position wireless charger provided in accordance with certain aspects disclosed herein.

The control system 1300 may be adapted to support one or more configurations of the receiving head 1202. FIG. 14 illustrates examples 1400, 1420 of receiver coil configurations in a receiving head 1202, and a circuit 1430 that can be used to quantify electromagnetic flux based on current induced in the receiving head 1202 by one or more transmitting coils of a charging surface. In the first example 1400, a receiver array 1402 includes multiple instances of a receiving coil 1404. In the illustrated example 1400, the receiver array 1402 includes nine receiving coils 1404. When used to measure or test characteristics of the charging surface, the receiver array 1402 may be positioned over or proximate to one or more transmitting coils 1406, 1408, 1410 in the surface of a wireless charging device. The receiver array 1402 can be used to measure electromagnetic flux distribution, null points and hot spots. The receiver array 1402 may function in the manner of a magnetic field camera, where resolution of the magnetic field camera is determined by the resolution of each receiving coil 1404.

In one mode of operation, a current is induced in in one or more receiving coil 1404. The current induced in each receiving coil 1404 is processed independently by an associated receiving circuit 1432. Each receiving circuit 1432 receives a current induced in its corresponding receiving coil 1404 and generates a measurement signal 1438 representative of the magnitude of detected electromagnetic flux or the magnitude of received power. In one example, the receiving circuit 1432 provides one or more measurement signals 1438 in which voltage represents the magnitude of the electromagnetic flux detected or the received power. An analog-to-digital converter (ADC) circuit 1434 provides a digital representation of each measurement signal 1438 to a processing circuit 1436.

In another mode of operation, the current induced in all of the receiving coils 1404 in the receiver array 1402 is combined in the receiving circuit 1432 to produce an aggregate current that can be used to assess power transfer by a configuration of transmitting coils. In this mode, the measurement signal 1438 represents the magnitude of aggregate detected electromagnetic flux or aggregate received power. The analog-to-digital converter (ADC) circuit 1434 provides a digital representation of the measurement signal 1438 to the processing circuit 1436.

In the second example 1420, a loop receiver 1422 is larger than each transmitting coil 1424 of the charging surface. The loop receiver 1422 may be configured to capture electromagnetic flux from a group of coils 1426. In the illustrated example 1420, the group of coils 1426 includes seven transmitting coils 1424. When used to measure or test characteristics of the charging surface, the loop receiver 1422 may be positioned over or proximate to an identified or selected the group of coils 1426 in the surface of a wireless charging device. The loop receiver 1422 can be used to sense or measure total electromagnetic flux generated by one or more active transmitting coils 1424. In this example 1420, the measurement signal 1440 provided by the loop receiver 1422 to the receiving circuit 1432 represents the magnitude of aggregate electromagnetic flux detected or aggregate received power. The analog-to-digital converter (ADC) circuit 1434 provides a digital representation of the measurement signal 1440 to the processing circuit 1436.

When electromagnetic flux generated by multiple active transmitting coils 1424 is measured, the active transmitting coils 1424 may connected in series or parallel, such that magnetic field strength generated by different transmitting coils 1424 or different groups of coils 1426 can be measured and normalized. In some instances, the loop receiver 1422 can be used to sense or measure total electromagnetic flux generated by multiple active transmitting coils 1424 or groups of coils 1426 that receive different currents, including currents of different magnitudes and/or phase shifts.

The processing circuit 1436 may store and/or process measurements of magnetic field intensity transmitted by one or more transmitting coils and/or received by one or more receiving coils. The measurements or information derived from the measurements may be stored locally and/or transmitted to a computing system for storage, aggregation, archiving and other processing.

In some examples, the receiver array 1402 or the loop receiver 1422 may be configured for measurement and control purposes. In some instances, the measurement and control module or circuit 1316 may use the receiver array 1402 or the loop receiver 1422 in the receiving head 1202 to respond to digital pings. In one example, the measurement and control module or circuit 1316 may modulate received electromagnetic flux or a charging current in a transmitting coil of the DUT by changing impedance presented through the receiver array 1402 or loop receiver 1422 in accordance with a modulating signal. The measurement and control module or circuit 1316 may be configured to request increases and/or decreases in transmitted power level through the modulating signal and may monitor received power to confirm that the DUT is responding appropriately.

Figure 15:
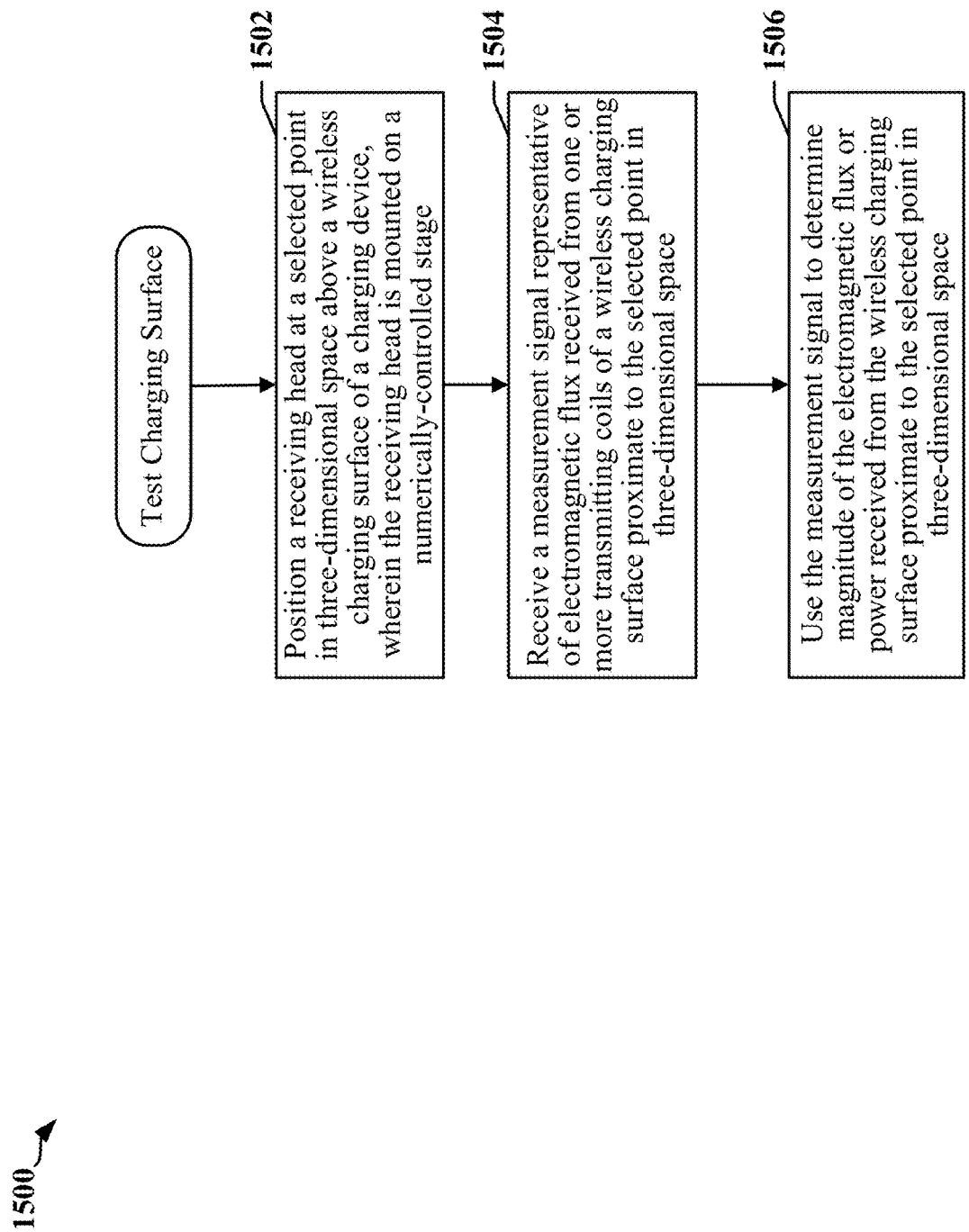
FIG. 15 is a flowchart illustrating a method of charging in accordance with certain aspects disclosed herein.

FIG. 15 is flowchart 1500 illustrating one example of a method for testing a charging surface. The method may be performed by a processor provided in a test rig. At block 1502, the processor may position a receiving head at a selected point in three-dimensional space above wireless charging surface. The receiving head may be mounted on a numerically-controlled stage. At block 1504, the processor may receive a measurement signal representative of electromagnetic flux received from one or more transmitting coils of a wireless charging surface proximate to the selected point in three-dimensional space. At block 1506, the processor may use the measurement signal to determine magnitude of the electromagnetic flux or power received from the wireless charging surface proximate to the selected point in three-dimensional space.

In one example, the receiving head has an array of receiving coils, where each receiving coil may provide a local signal representative of electromagnetic flux detected by the receiving coil. The processor may use a plurality of local signals generated by the array of receiving coils to determine magnitude of electromagnetic flux or power received from the wireless charging surface proximate to the array of receiving coils. In one example, the processor may determine or calculate the magnitude of the electromagnetic flux or power received from the wireless charging surface by determining the magnitude of electromagnetic flux or power received by each coil in the array of receiving coils in the receiving head. In some examples, each receiving coil provides a local signal representative of electromagnetic flux detected or received by the each receiving coil. In another example, the processor may combine currents provided by the array of receiving coils to obtain the measurement signal.

In another example, the receiving head has a loop receiver configured to be placed over an area that includes a plurality of transmitting coils of the wireless charging surface. The processor may measure total electromagnetic flux generated by the plurality of transmitting coils of the wireless charging surface. In some instances, the processor may obtain a measurement of the current generated by the loop receiver in response to the electromagnetic flux and may determine the magnitude of the electromagnetic flux or power received from the wireless charging surface based on the current generated by the loop receiver. Electromagnetic flux received from two of the plurality of transmitting coils may have different phases.

In one example, the processor may modulate the electromagnetic flux received from the one or more transmitting coils in accordance with a digital signal carrying a command directed to charging device, wherein the electromagnetic flux is modulated by modifying an impedance of a circuit in the receiving head.

Example of a Processing Circuit

Figure 16:
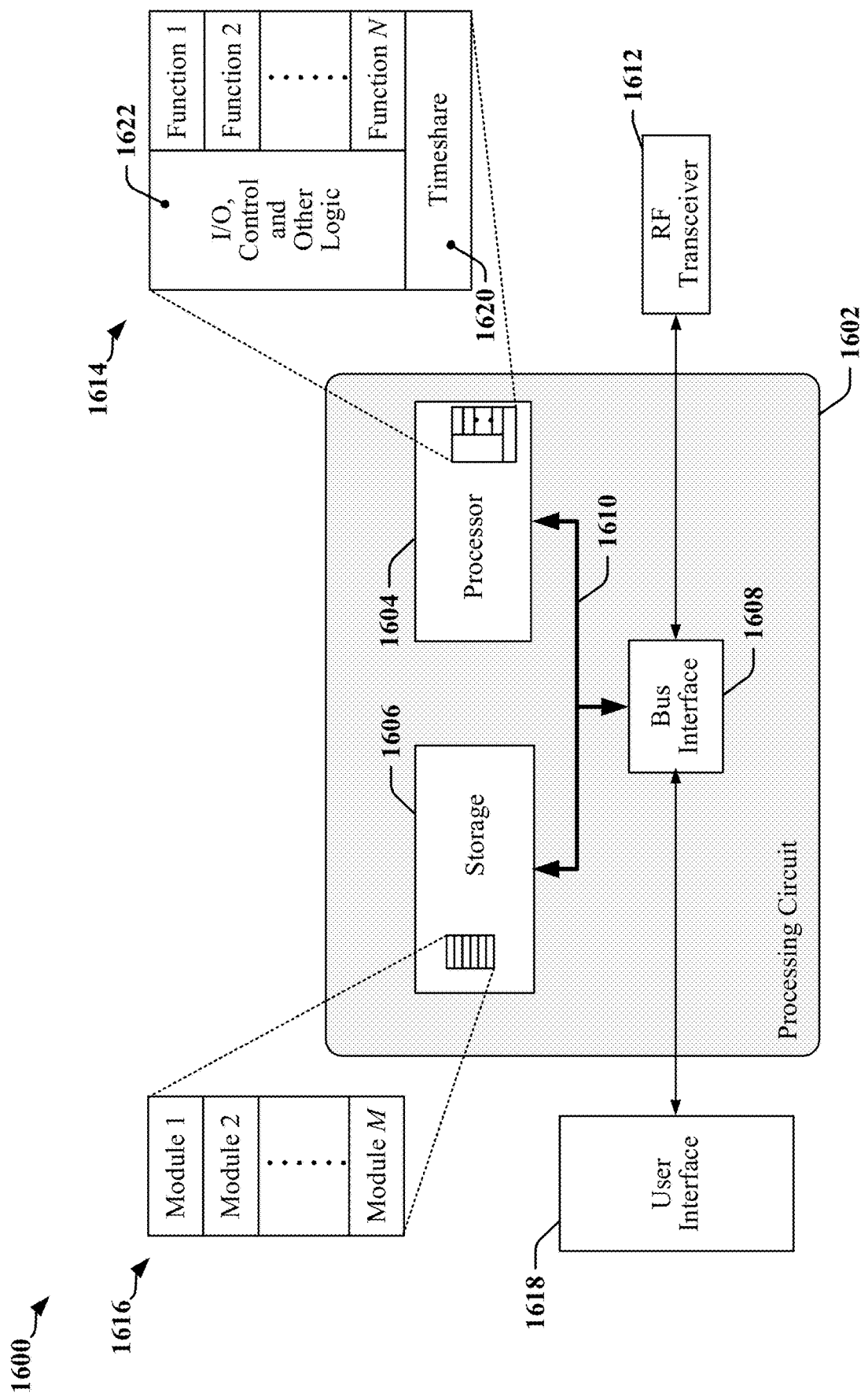
FIG. 16 illustrates one example of an apparatus employing a processing circuit that may be adapted according to certain aspects disclosed herein.

FIG. 16 illustrates an example of a hardware implementation for an apparatus 1600 that may be incorporated in a charging device or in a receiving device that enables a battery to be wirelessly charged. In some examples, the apparatus 1600 may perform one or more functions disclosed herein. In accordance with various aspects of the disclosure, an element, or any portion of an element, or any combination of elements as disclosed herein may be implemented using a processing circuit 1602. The processing circuit 1602 may include one or more processors 1604 that are controlled by some combination of hardware and software modules. Examples of processors 1604 include microprocessors, microcontrollers, digital signal processors (DSPs), SoCs, ASICs, field programmable gate arrays (FPGAs), programmable logic devices (PLDs), CNC controllers, state machines, sequencers, gated logic, discrete hardware circuits, and other suitable hardware configured to perform the various functionality described throughout this disclosure. The one or more processors 1604 may include specialized processors that perform specific functions, and that may be configured, augmented or controlled by one of the software modules 1616. The one or more processors 1604 may be configured through a combination of software modules 1616 loaded during initialization, and further configured by loading or unloading one or more software modules 1616 during operation.

In the illustrated example, the processing circuit 1602 may be implemented with a bus architecture, represented generally by the bus 1610. The bus 1610 may include any number of interconnecting buses and bridges depending on the specific application of the processing circuit 1602 and the overall design constraints. The bus 1610 links together various circuits including the one or more processors 1604, and storage 1606. Storage 1606 may include memory devices and mass storage devices, and may be referred to herein as computer-readable media and/or processor-readable media. The storage 1606 may include transitory storage media and/or non-transitory storage media.

The bus 1610 may also link various other circuits such as timing sources, timers, peripherals, voltage regulators, and power management circuits. A bus interface 1608 may provide an interface between the bus 1610 and one or more transceivers 1612. In one example, a transceiver 1612 may be provided to enable the apparatus 1600 to communicate with a charging or receiving device in accordance with a standards-defined protocol. Depending upon the nature of the apparatus 1600, a user interface 1618 (e.g., keypad, display, speaker, microphone, joystick) may also be provided, and may be communicatively coupled to the bus 1610 directly or through the bus interface 1608.

A processor 1604 may be responsible for managing the bus 1610 and for general processing that may include the execution of software stored in a computer-readable medium that may include the storage 1606. In this respect, the processing circuit 1602, including the processor 1604, may be used to implement any of the methods, functions and techniques disclosed herein. The storage 1606 may be used for storing data that is manipulated by the processor 1604 when executing software, and the software may be configured to implement any one of the methods disclosed herein.

One or more processors 1604 in the processing circuit 1602 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1606 or in an external computer-readable medium. The external computer-readable medium and/or storage 1606 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 1606 may also include, by way of example, a carrier wave, a transmission line, and any other suitable medium for transmitting software and/or instructions that may be accessed and read by a computer. Computer-readable medium and/or the storage 1606 may reside in the processing circuit 1602, in the processor 1604, external to the processing circuit 1602, or be distributed across multiple entities including the processing circuit 1602. The computer-readable medium and/or storage 1606 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1606 may maintain and/or organize software in loadable code segments, modules, applications, programs, etc., which may be referred to herein as software modules 1616. Each of the software modules 1616 may include instructions and data that, when installed or loaded on the processing circuit 1602 and executed by the one or more processors 1604, contribute to a run-time image 1614 that controls the operation of the one or more processors 1604. When executed, certain instructions may cause the processing circuit 1602 to perform functions in accordance with certain methods, algorithms and processes described herein.

Some of the software modules 1616 may be loaded during initialization of the processing circuit 1602, and these software modules 1616 may configure the processing circuit 1602 to enable performance of the various functions disclosed herein. For example, some software modules 1616 may configure internal devices and/or logic circuits 1622 of the processor 1604, and may manage access to external devices such as a transceiver 1612, the bus interface 1608, the user interface 1618, timers, mathematical coprocessors, and so on. The software modules 1616 may include a control program and/or an operating system that interacts with interrupt handlers and device drivers, and that controls access to various resources provided by the processing circuit 1602. The resources may include memory, processing time, access to a transceiver 1612, the user interface 1618, and so on.

One or more processors 1604 of the processing circuit 1602 may be multifunctional, whereby some of the software modules 1616 are loaded and configured to perform different functions or different instances of the same function. The one or more processors 1604 may additionally be adapted to manage background tasks initiated in response to inputs from the user interface 1618, the transceiver 1612, and device drivers, for example. To support the performance of multiple functions, the one or more processors 1604 may be configured to provide a multitasking environment, whereby each of a plurality of functions is implemented as a set of tasks serviced by the one or more processors 1604 as needed or desired. In one example, the multitasking environment may be implemented using a timesharing program 1620 that passes control of a processor 1604 between different tasks, whereby each task returns control of the one or more processors 1604 to the timesharing program 1620 upon completion of any outstanding operations and/or in response to an input such as an interrupt. When a task has control of the one or more processors 1604, the processing circuit is effectively specialized for the purposes addressed by the function associated with the controlling task. The timesharing program 1620 may include an operating system, a main loop that transfers control on a round-robin basis, a function that allocates control of the one or more processors 1604 in accordance with a prioritization of the functions, and/or an interrupt driven main loop that responds to external events by providing control of the one or more processors 1604 to a handling function.

In one implementation, the apparatus 1600 includes or operates as a test device. The apparatus 1600 may have a receiving head, a numerically-controlled stage and a processor. The receiving head may be configured to provide a measurement signal representative of electromagnetic flux received from one or more transmitting coils of a wireless charging surface. The numerically-controlled stage may be configured to position the receiving head at a selected point in three-dimensional space above wireless charging surface. The processor may be configured to cause the numerically-controlled stage to position the receiving head at the selected point in three-dimensional space, and use the measurement signal to determine magnitude of the electromagnetic flux or power received from the wireless charging surface proximate to the selected point in three-dimensional space.

In one example, the receiving head has an array of receiving coils, where each receiving coil provides a local signal representative of electromagnetic flux detected by the each receiving coil. The processor may be configured to use a plurality of local signals generated by the array of receiving coils to determine magnitude of electromagnetic flux or power received from the wireless charging surface proximate to the array of receiving coils.

In another example, the receiving head has an array of receiving coils, where each receiving coil provides a current representative of electromagnetic flux detected by the each receiving coil. The receiving circuit may be configured to combine a plurality of currents provided by the array of receiving coils to obtain the measurement signal.

In another example, the receiving head has a loop receiver configured to be placed over an area that includes a plurality of transmitting coils of the wireless charging surface. The processor may be configured to measure total electromagnetic flux generated by the plurality of transmitting coils of the wireless charging surface. In some instances, the electromagnetic flux received from two of the plurality of transmitting coils have different phases.

In some implementations, the apparatus 1600 has a CNC controller configured to operate the numerically-controlled stage responsive to one or more instructions received from the processor.

In some implementations, the storage 1606 maintains instructions and information where the instructions are configured to cause the one or more processors 1604 to manage a test procedure in accordance with certain aspects disclosed herein. For example, the instructions cause the one or more processors 1604 to position a receiving head at a selected point in three-dimensional space above wireless charging surface, receive a measurement signal representative of electromagnetic flux received from one or more transmitting coils of a wireless charging surface proximate to the selected point in three-dimensional space, and use the measurement signal to determine magnitude of the electromagnetic flux or power received from the wireless charging surface proximate to the selected point in three-dimensional space. The receiving head may be mounted on a numerically-controlled stage In one example, the receiving head has an array of receiving coils, where each receiving coil may provide a local signal representative of electromagnetic flux detected by the receiving coil. The instructions may cause the one or more processors 1604 to use a plurality of local signals generated by the array of receiving coils to determine magnitude of electromagnetic flux or power received from the wireless charging surface proximate to the array of receiving coils. In one example, the instructions may cause the one or more processors 1604 to determine or calculate the magnitude of the electromagnetic flux or power received from the wireless charging surface by determining the magnitude of electromagnetic flux or power received by each coil in the array of receiving coils in the receiving head. In some examples, each receiving coil provides a local signal representative of electromagnetic flux detected or received by the each receiving coil. In another example, the instructions may cause the one or more processors 1604 to combine currents provided by the array of receiving coils to obtain the measurement signal.

In another example, the receiving head has a loop receiver configured to be placed over an area that includes a plurality of transmitting coils of the wireless charging surface. The instructions may cause the one or more processors 1604 to measure total electromagnetic flux generated by the plurality of transmitting coils of the wireless charging surface. In some instances, the instructions may cause the one or more processors 1604 to obtain a measurement of the current generated by the loop receiver in response to the electromagnetic flux and to determine the magnitude of the electromagnetic flux or power received from the wireless charging surface based on the current generated by the loop receiver. Electromagnetic flux received from two of the plurality of transmitting coils may have different phases.

In some examples, the instructions may cause the one or more processors 1604 to modulate the electromagnetic flux received from the one or more transmitting coils in accordance with a digital signal carrying a command directed to charging device, wherein the electromagnetic flux is modulated by modifying an impedance of a circuit in the receiving head.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A test apparatus, comprising:
 a receiving head configured to provide a measurement signal representative of electromagnetic flux received from one or more transmitting coils in a wireless charging surface of a charging device, wherein the receiving head includes an array of receiving coils, and wherein each receiving coil provides a local signal representative of electromagnetic flux detected by the each receiving coil;

a numerically-controlled stage configured to position the receiving head at a selected point in three-dimensional space above the wireless charging surface; and a processor configured to:
cause the numerically-controlled stage to position the receiving head at the selected point in three-dimensional space;
use a plurality of local signals generated by the array of receiving coils to determine magnitude of electromagnetic flux or power received from the wireless charging surface proximate to the array of receiving coils; and
use the measurement signal to determine magnitude of the electromagnetic flux or power received from the wireless charging surface proximate to the selected point in three-dimensional space.

2. The test apparatus of claim 1, wherein each receiving coil provides a current representative of electromagnetic flux detected by the each receiving coil, the test apparatus further comprising:
a receiving circuit configured to combine a plurality of currents provided by the array of receiving coils to obtain the measurement signal.

3. The test apparatus of claim 1, further comprising:
a computer numerical control controller configured to operate the numerically-controlled stage responsive to one or more instructions received from the processor.

4. A test apparatus, comprising:
a receiving head configured to provide a measurement signal representative of total electromagnetic flux received from one or more transmitting coils in a wireless charging surface of a charging device, wherein the receiving head includes a loop receiver configured to be placed over an area that includes a plurality of transmitting coils of the wireless charging surface;
a numerically-controlled stage configured to position the receiving head at a selected point in three-dimensional space above the wireless charging surface; and
a processor configured to:
cause the numerically controlled stage to position the receiving head at the selected point in three-dimensional space; and
use the measurement signal to determine magnitude of the electromagnetic flux or power received from the wireless charging surface proximate to the selected point in three-dimensional space.

5. The test apparatus of claim 4, wherein electromagnetic flux received from two of the plurality of transmitting coils have different phases.

6. A method for testing a charging surface, comprising:
positioning a receiving head at a selected point in three-dimensional space above a wireless charging surface in a charging device, wherein the receiving head is mounted on a numerically-controlled stage and includes an array of receiving coils, and wherein each receiving coil provides a local signal representative of electromagnetic flux detected by the each receiving coil;
determining a magnitude of electromagnetic flux or power received by each of the array of receiving coils;
receiving a measurement signal representative of electromagnetic flux received from one or more transmitting coils of a wireless charging surface proximate to the selected point in three-dimensional space; and
using the measurement signal to determine magnitude of the electromagnetic flux or power received from the wireless charging surface proximate to the selected point in three-dimensional space.

7. The method of claim 6, further comprising:
combining currents generated by the array of receiving coils in response to the electromagnetic flux to obtain the measurement signal.

8. The method of claim 6, further comprising:
modulating the electromagnetic flux received from the one or more transmitting coils in accordance with a digital signal carrying a command directed to charging device, wherein the electromagnetic flux is modulated by modifying an impedance of a circuit in the receiving head.

9. A method for testing a charging surface comprising:
positioning a receiving head at a selected point in three-dimensional space above a wireless charging surface in a charging device, wherein the receiving head is mounted on a numerically-controlled stage;
receiving a measurement signal representative of electromagnetic flux received from one or more transmitting coils of a wireless charging surface proximate to the selected point in three-dimensional space, wherein the receiving head comprises a loop receiver configured to be placed over an area that includes a plurality of transmitting coils of the wireless charging surface; and
using the measurement signal to determine magnitude of the electromagnetic flux or power received from the wireless charging surface proximate to the selected point in three-dimensional space.

10. The method of claim 9, further comprising:
measuring current generated by the loop receiver in response to the electromagnetic flux; and
determining the magnitude of the electromagnetic flux or power received from the wireless charging surface based on the current generated by the loop receiver.

11. The method of claim 9, wherein electromagnetic flux received from two of the plurality of transmitting coils have different phases.

12. A non-transitory processor readable storage medium, comprising code for:
positioning a receiving head at a selected point in three-dimensional space above a wireless charging surface of a charging device, wherein the receiving head is mounted on a numerically-controlled stage and includes an array of receiving coils, and wherein each receiving coil provides a local signal representative of electromagnetic flux detected by the each receiving coil;
determining a magnitude of electromagnetic flux or power received by each of the array of receiving coils;
receiving a measurement signal representative of electromagnetic flux received from one or more transmitting coils of a wireless charging surface proximate to the selected point in three-dimensional space; and
using the measurement signal to determine magnitude of the electromagnetic flux or power received from the wireless charging surface proximate to the selected point in three-dimensional space.

13. The storage medium of claim 12, further comprising code for:
combining currents generated by the array of receiving coils in response to the electromagnetic flux to obtain the measurement signal.

14. The storage medium of claim 12, further comprising code for:
modulating the electromagnetic flux received from the one or more transmitting coils in accordance with a digital signal carrying a command directed to charging device, wherein the electromagnetic flux is modulated by modifying an impedance of a circuit in the receiving head.

15. A non-transitory processor readable storage medium, comprising code for:
  positioning a receiving head at a selected point in three-dimensional space above a wireless charging surface of a charging device, wherein the receiving head is mounted on a numerically-controlled stage;
  receiving a measurement signal representative of electromagnetic flux received from one or more transmitting coils of a wireless charging surface proximate to the selected point in three-dimensional space, wherein the receiving head comprises a loop receiver configured to be placed over an area that includes a plurality of transmitting coils of the wireless charging surface, and
  using the measurement signal to determine magnitude of the electromagnetic flux or power received from the wireless charging surface proximate to the selected point in three-dimensional space.

16. The storage medium of claim 15, further comprising code for:
  measuring current generated by the loop receiver in response to the electromagnetic flux; and
  determining the magnitude of the electromagnetic flux or power received from the wireless charging surface based on the current generated by the loop receiver.

17. The storage medium of claim 15, wherein electromagnetic flux received from two of the plurality of transmitting coils have different phases.

* * * * *